United States Patent
Mihara

(10) Patent No.: US 10,192,965 B2
(45) Date of Patent: Jan. 29, 2019

(54) SEMICONDUCTOR DEVICE INCLUDING FIRST AND SECOND GATE ELECTRODES AND METHOD FOR MANUFACTURING THE SAME

(71) Applicant: Renesas Electronics Corporation, Tokyo (JP)

(72) Inventor: Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 17 days.

(21) Appl. No.: 15/512,475

(22) PCT Filed: Mar. 30, 2015

(86) PCT No.: PCT/JP2015/060023
§ 371 (c)(1),
(2) Date: Mar. 17, 2017

(87) PCT Pub. No.: WO2016/157393
PCT Pub. Date: Oct. 6, 2016

(65) Prior Publication Data
US 2017/0278938 A1    Sep. 28, 2017

(51) Int. Cl.
*H01L 29/423* (2006.01)
*H01L 21/02* (2006.01)
(Continued)

(52) U.S. Cl.
CPC .. *H01L 29/42344* (2013.01); *H01L 21/02233* (2013.01); *H01L 21/28282* (2013.01);
(Continued)

(58) Field of Classification Search
CPC ........... H01L 29/42344; H01L 27/1158; H01L 29/7853; H01L 21/3086
See application file for complete search history.

(56) References Cited

U.S. PATENT DOCUMENTS

| 6,388,293 B1 | 5/2002 | Ogura et al. |
| 2003/0042533 A1* | 3/2003 | Noro ................. H01L 21/28273 257/316 |
| 2004/0188753 A1 | 9/2004 | Kawashima et al. |
| 2005/0026368 A1* | 2/2005 | Chu ................. H01L 21/28273 438/259 |

(Continued)

FOREIGN PATENT DOCUMENTS

| JP | 2001-148434 A | 5/2001 |
| JP | 2001-168219 A | 6/2001 |

(Continued)

OTHER PUBLICATIONS

International Search Report (IST) (PCT Form PCT/ISA/210), in PCT/JP2015/060023, dated Jun. 23, 2015.

*Primary Examiner* — Lex Malsawma
*Assistant Examiner* — Laura Dykes
(74) *Attorney, Agent, or Firm* — McGinn IP Law Group, PLLC

(57) ABSTRACT

A semiconductor substrate (1) includes a region (AR3) between a region (AR1) and a region (AR2), a control gate electrode (CG) is formed on an upper surface (TS1) of the region (AR1), and a memory gate electrode (MG) is formed on an upper surface (TS2) of the region (AR2). The upper surface (TS2) is lower than the upper surface (TS1), and the region (AR3) has a connection surface (TS3) connecting the upper surface (TS1) and the upper surface (TS2). An end (EP1) of the connection surface (TS3) which is on the upper surface (TS2) side is arranged closer to the memory gate electrode (MG) than an end (EP2) of the connection surface (TS3) which is on the upper surface (TS1) side, and is arranged lower than the end (EP2).

15 Claims, 32 Drawing Sheets

(51) Int. Cl.
  *H01L 21/28* (2006.01)
  *H01L 21/306* (2006.01)
  *H01L 21/308* (2006.01)
  *H01L 21/311* (2006.01)
  *H01L 21/3213* (2006.01)
  *H01L 27/11568* (2017.01)
  *H01L 29/06* (2006.01)
  *H01L 29/66* (2006.01)
  *H01L 29/792* (2006.01)
  *H01L 27/1157* (2017.01)

(52) U.S. Cl.
  CPC .... *H01L 21/3086* (2013.01); *H01L 21/30604* (2013.01); *H01L 21/31111* (2013.01); *H01L 21/3213* (2013.01); *H01L 27/1157* (2013.01); *H01L 27/11568* (2013.01); *H01L 29/0684* (2013.01); *H01L 29/4238* (2013.01); *H01L 29/66833* (2013.01); *H01L 29/792* (2013.01)

(56) References Cited

U.S. PATENT DOCUMENTS

| | | |
|---|---|---|
| 2008/0048249 A1 | 2/2008 | Tega et al. |
| 2010/0025753 A1 | 2/2010 | Terai |

FOREIGN PATENT DOCUMENTS

| | | |
|---|---|---|
| JP | 2004-303918 A | 10/2004 |
| JP | 2006-332143 A | 12/2006 |
| JP | 2008/053498 A | 3/2008 |
| WO | WO 2008/059768 A1 | 5/2008 |

\* cited by examiner

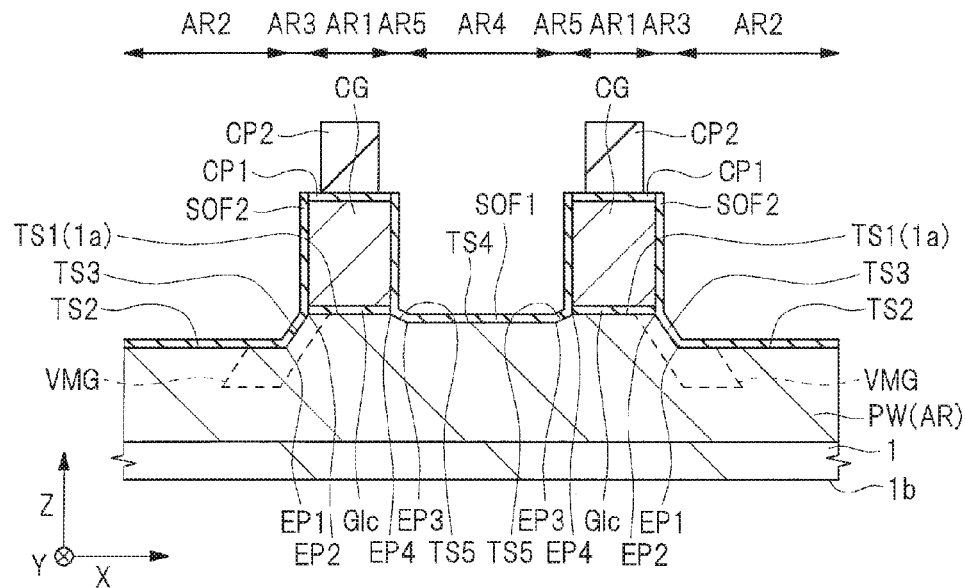
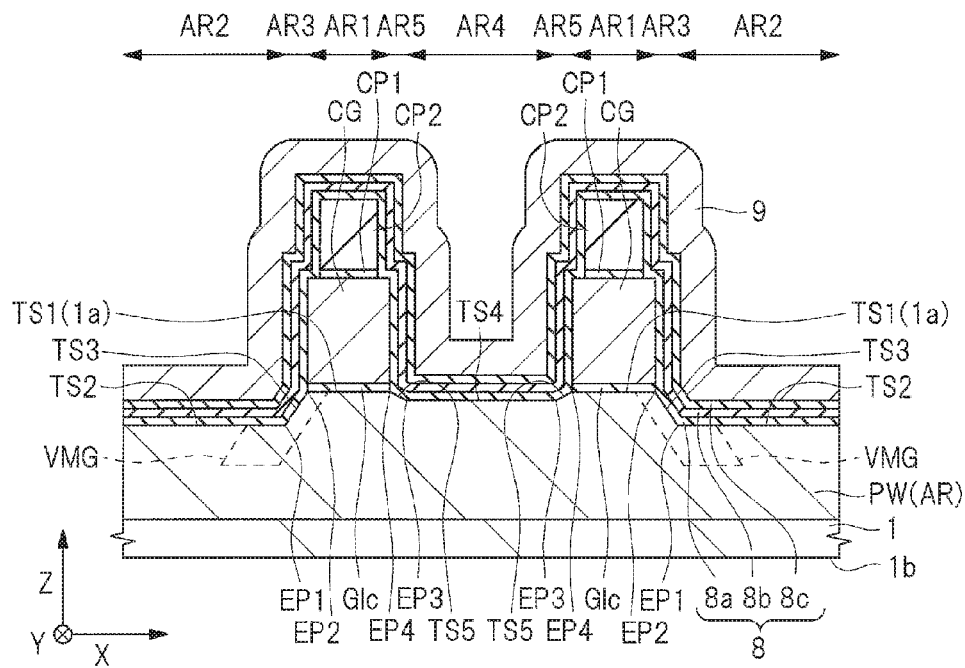

SEMICONDUCTOR DEVICE INCLUDING FIRST AND SECOND GATE ELECTRODES AND METHOD FOR MANUFACTURING THE SAME

TECHNICAL FIELD

The present invention relates to a semiconductor device and a method for manufacturing the same, and is preferably usable for, for example, a semiconductor device including a semiconductor element formed on a semiconductor substrate and a method for manufacturing the same.

BACKGROUND ART

A semiconductor device including a memory cell region where a memory cell such as a nonvolatile memory is formed on a semiconductor substrate has been widely used. As the nonvolatile memory, for example, the memory cell formed of a split-gate type cell using a MONOS (Metal-Oxide-Nitride-Oxide-Semiconductor) film is formed in some cases. At this time, the memory cell is formed by two MISFETs (Metal Insulator Semiconductor Field Effect Transistors) that region control transistor having a control gate electrode and a memory transistor having a memory gate electrode.

This memory gate electrode is formed by making a conductive film remain on a side surface of the control gate electrode via an insulating film in a sidewall spacer shape. An insulating film having a charge accumulating portion therein is formed between the memory gate electrode and the control gate electrode and between the memory gate electrode and a semiconductor substrate.

Japanese Patent Application Laid-Open Publication No. 2006-332143 (Patent Document 1) discloses a technique for a semiconductor device including a nonvolatile storage element formed in a semiconductor substrate, the nonvolatile storage element having a control gate electrode and a memory gate electrode provided adjacent to the control gate electrode.

RELATED ART DOCUMENT

Patent Document

Patent Document 1: Japanese Patent Application Laid-Open Publication No. 2006-332143

SUMMARY OF THE INVENTION

Problems to be Solved by the Invention

In a semiconductor device including a memory cell formed of such a split-gate type cell, data is written by, for example, injecting electrons into a charge accumulating portion inside an insulating film. And, data is erased by injecting holes into the charge accumulating portion inside the insulating film.

Meanwhile, a distribution of electrons injected into the charge accumulating portion when data is written and a distribution of holes injected into the charge accumulating portion when data is erased are different from each other depending on a shape of the charge accumulating portion in some cases. In such a case, when a writing operation and an erasing operation are repeated many times, the number of holes remaining in the insulating film including the charge accumulating portion increases, and a retention property of the memory cell decreases, and therefore, a property of the semiconductor device cannot be improved.

Other object and novel characteristics of the present invention will be apparent from the description of the present specification and the accompanying drawings.

Means for Solving the Problems

According to one embodiment, a semiconductor substrate includes a third region arranged between a first region and a second region, a control gate electrode is formed on a first upper surface of the first region, and a memory gate electrode is formed on a second upper surface of the second region. The second upper surface is lower than the first upper surface, and the third region has a connection surface connecting the first upper surface and the second upper surface. A gate insulating film having a charge accumulating portion therein is formed between the memory gate electrode and the control gate electrode, between the memory gate electrode and the second upper surface, and between the memory gate electrode and the connection surface. A first end of the connection surface, which is closer to the second upper surface, is arranged closer to the memory gate electrode than a second end of the connection surface, which is closer to the first upper surface, and the first end is arranged lower than the second end.

According to another embodiment, in a method for manufacturing a semiconductor device, a semiconductor substrate including a third region arranged between a first region and a second region is prepared. Then, a control gate electrode is formed on a first upper surface of a first region. Then, by etching the second region and the third region, a second upper surface of the second region is formed to be lower than the first upper surface, and a connection surface connecting the first upper surface and the second upper surface is formed in the third region. Then, an insulating film having a charge accumulating portion therein is formed on the semiconductor substrate and on a surface of the control gate electrode, and a conductive film is formed on the insulating film. Then, by etching back the conductive film, a memory gate electrode is formed on the second upper surface to form a gate insulating film formed of insulating films between the memory gate electrode and the control gate electrode, between the memory gate electrode and the second upper surface, and between the memory gate electrode and the connection surface. A first end of the connection surface, which is closer to the second upper surface, is arranged closer to the memory gate electrode than a second end of the connection surface, which is closer to the first upper surface, and the first end is arranged lower than the second end.

Effects of the Invention

According to one embodiment, a performance of a semiconductor device can be improved.

BRIEF DESCRIPTIONS OF THE DRAWINGS

FIG. 17 is a cross-sectional view of a principal part during a manufacturing process of a semiconductor device according to an embodiment;

FIG. 18 is a cross-sectional view of a principal part during a manufacturing process of a semiconductor device according to an embodiment;

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and others), the number of the elements is not limited to a specific number unless otherwise stated or except the case in which the number is apparently limited to a specific number in principle. The number larger or smaller than the specified number is also applicable.

Further, in the embodiments described below, it goes without saying that the components (including element steps) are not always indispensable unless otherwise stated or except the case in which the components are apparently indispensable in principle. Similarly, in the embodiments described below, when the shape of the components, positional relation thereof, and others are mentioned, the substantially approximate and similar shapes and others are included therein unless otherwise stated or except the case in which it is conceivable that they are apparently excluded in principle. The same goes for the numerical value and the range described above.

Hereinafter, a typical embodiment will be described in detail based on the accompanying drawings. Note that components having the same function are denoted by the same reference symbols throughout all the drawings for describing the embodiment, and the repetitive description thereof will be omitted. In addition, the description of the same or similar portions is not repeated in principle unless otherwise particularly required in the following embodiments.

Further, in some drawings used in the embodiment, hatching is omitted in some cases even in a cross-sectional view so as to make the drawings easy to see.

(Embodiment)

<Structure of Semiconductor Device>

Figure 1:
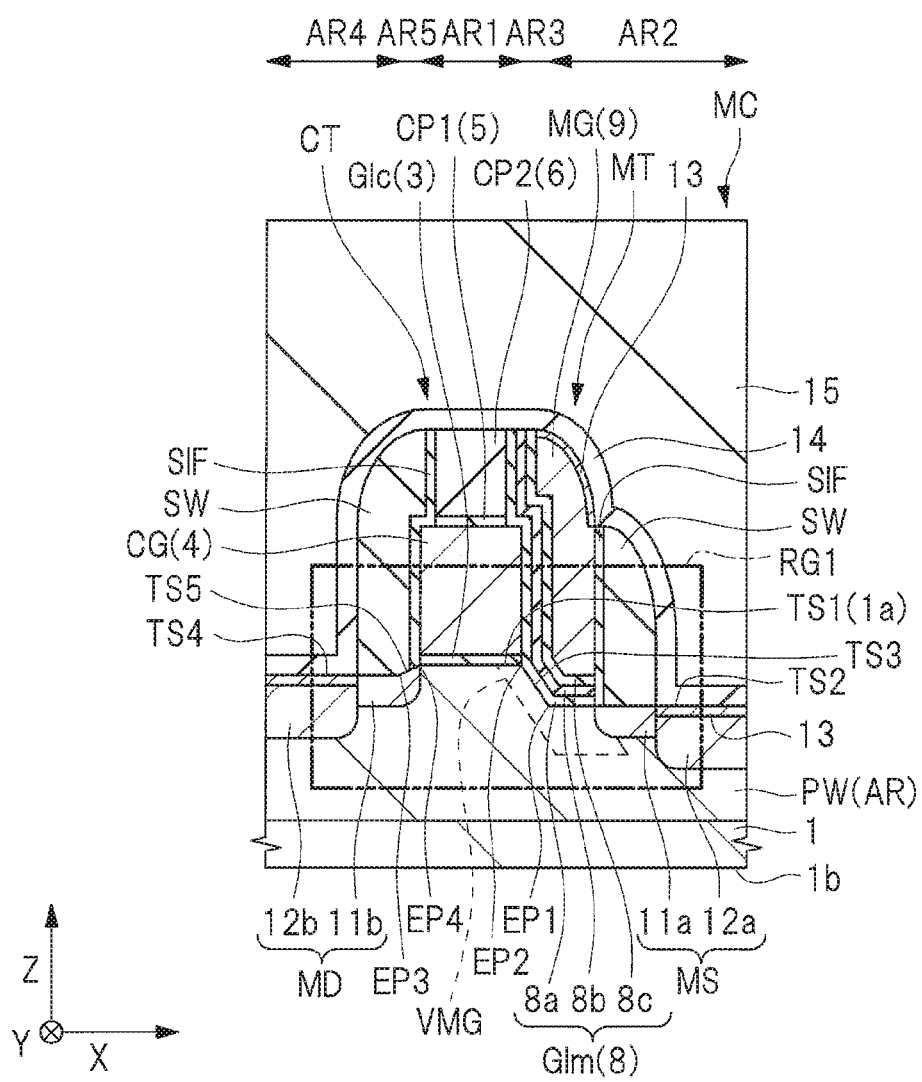
FIG. 1 is a cross-sectional view of a principal part of a semiconductor device according to an embodiment.
Figure 2:
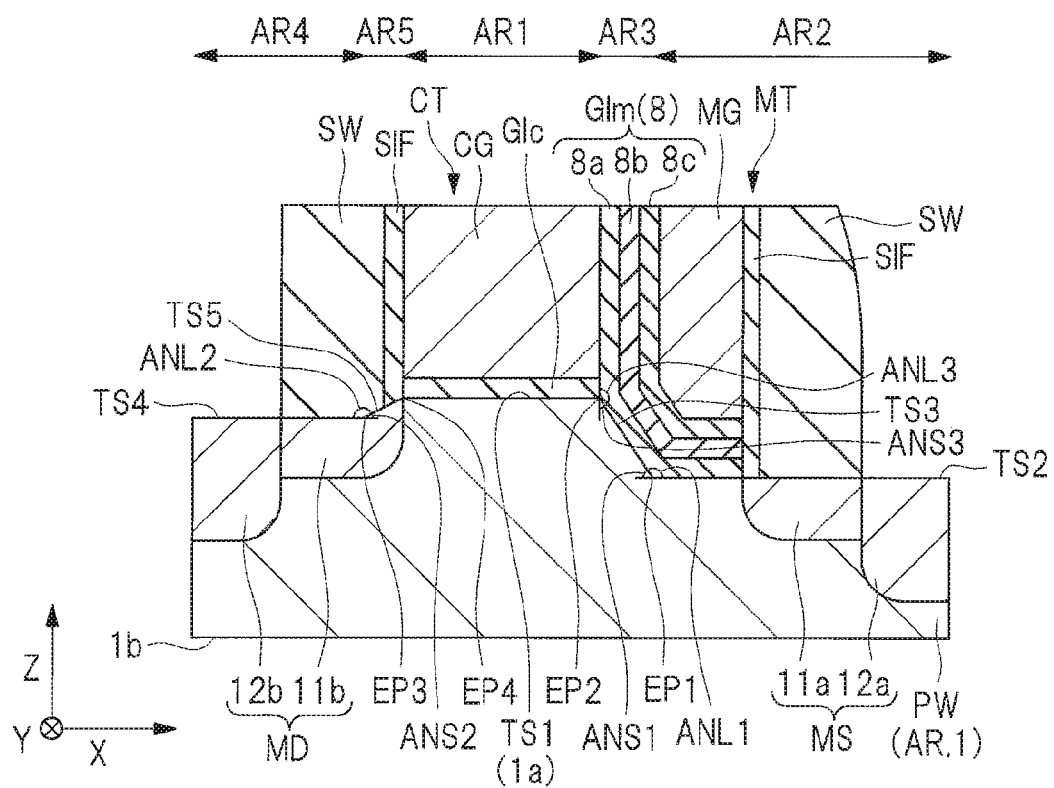
FIG. 2 is a cross-sectional view of a principal part of a semiconductor device according to an embodiment.
Figure 3:
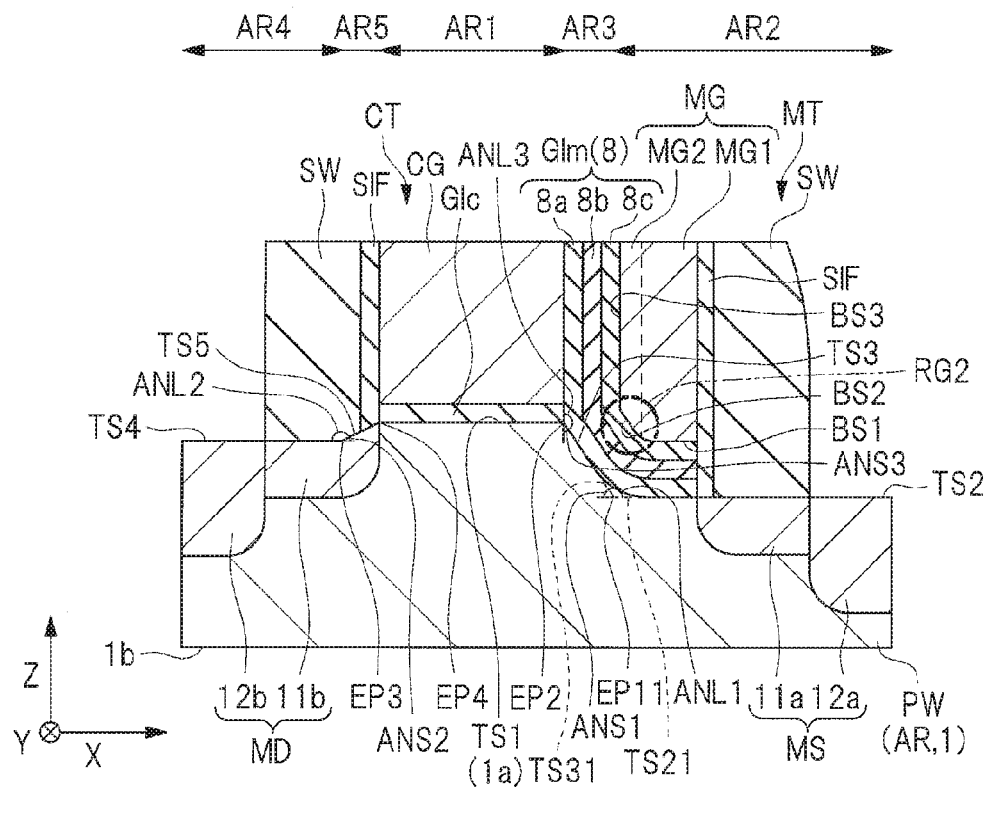
FIG. 3 is a cross-sectional view of a principal part of a semiconductor device according to an embodiment.
Figure 4:
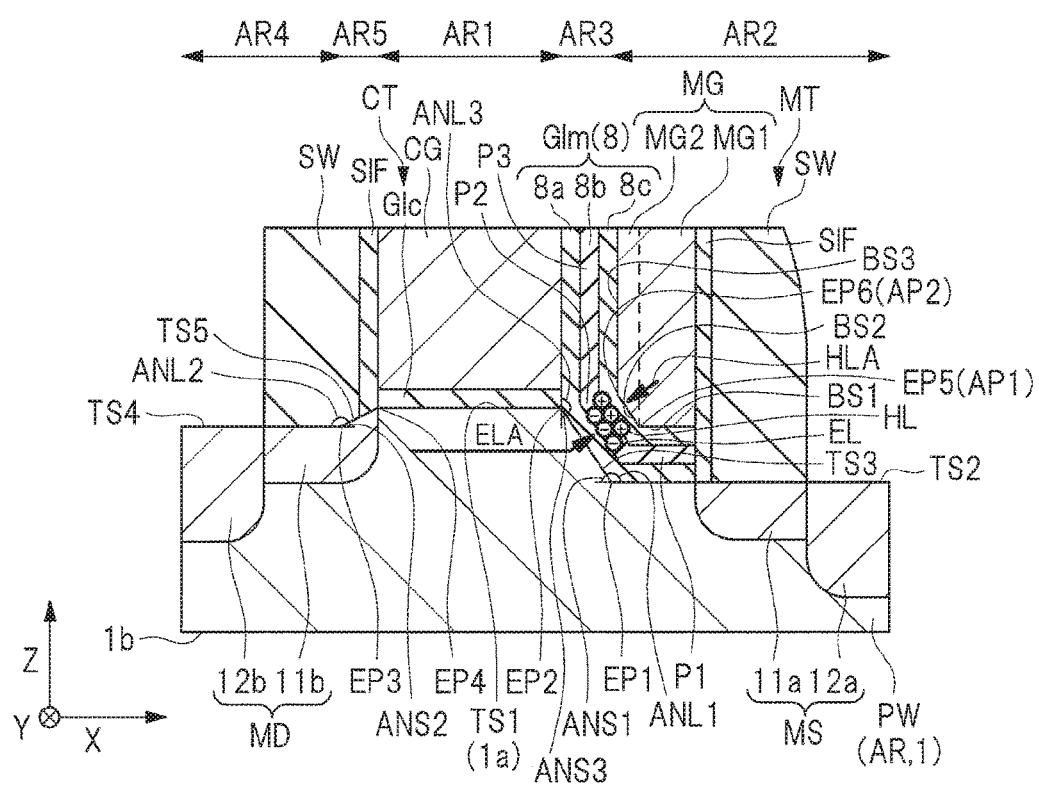
FIG. 4 is a cross-sectional view of a principal part of a semiconductor device according to an embodiment.

First, a structure of a semiconductor device according to the present embodiment will be described. Each of FIGS. 1 to 4 is a cross-sectional view of a principal part of the semiconductor device according to the embodiment. In each cross-sectional view of FIGS. 2 to 4, a region RG1 surrounded by a two-dot and dash line in the cross-sectional view of FIG. 1 is illustrated while being enlarged. In FIGS. 2 to 4, note that illustration of an n⁻-type semiconductor region VMG, a metal silicide layer 13, an insulating film 14, and an interlayer insulating film 15 is omitted.

As illustrated in FIGS. 1 to 4, two directions intersecting, more preferably, orthogonal to each other within a main surface 1a of a semiconductor substrate 1 are set as an X-axis direction and a Y-axis direction, respectively, and a direction perpendicular to the main surface 1a of the semiconductor substrate 1, i.e., an up and down direction is set as a Z-axis direction. In the specification of the present application, a term "in a plan view" means a case of view from the direction perpendicular to the main surface 1a of the semiconductor substrate 1.

As illustrated in FIG. 1, the semiconductor device includes a semiconductor substrate 1. The semiconductor substrate 1 is a semiconductor wafer formed of a p-type single-crystal silicon having a specific resistance of, for example, about 1 to 10 Ωcm. The semiconductor substrate 1 has the main surface 1a and a main surface 1b on the opposite side to the main surface 1a.

The semiconductor substrate 1 has an active region AR serving as a region closer to the main surface 1a. The active region AR is defined, that is, partitioned by an element isolation region (illustration is omitted), and is electrically isolated from another active region by the element isolation region. A p-type well PW is formed in the active region AR. The P-type well PW has a p-type conductivity.

Figure 27:
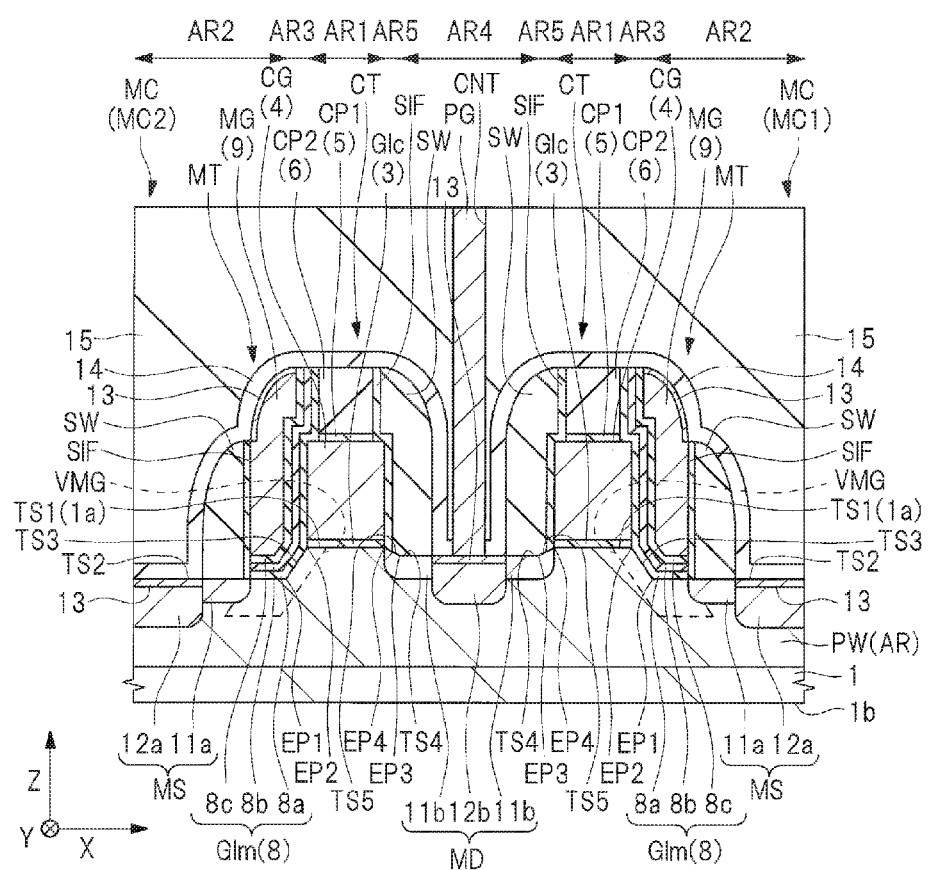
FIG. 27 is a cross-sectional view of a principal part during a manufacturing process of a semiconductor device according to an embodiment.

As illustrated in FIG. 1, a memory cell MC formed of a memory transistor MT and a control transistor CT is formed in the p-type well PW. Note that a plurality of memory cells MC are practically formed in an array form, and, for example, each cross-sectional surface of two memory cells MC is illustrated in FIG. 27 described below.

The memory cell MC is a memory cell of a split gate type. In other words, as shown in FIG. 1, the memory cell MC has a control transistor CT having a control gate electrode CG and a memory transistor MT connected to the control transistor CT and having a memory gate electrode MG.

The memory cell MC has an n-type semiconductor region MS, an n-type semiconductor region MD, the control gate electrode CG, and the memory gate electrode MG. Each of the n-type semiconductor region MS and the n-type semiconductor region MD has an n-conductivity type that is an opposite conductivity type to the p-conductivity type. The control gate electrode CG is formed on the main surface 1a of the semiconductor substrate 1, and the memory gate electrode MG is formed on the semiconductor substrate 1. The memory cell MC includes cap insulating films CP1 and CP2 formed on the control gate electrode CG.

Furthermore, the memory cell MC has a gate insulating film GIc formed between the control gate electrode CG and the semiconductor substrate 1 and a gate insulating film GIm formed between the memory gate electrode MG and the semiconductor substrate 1 and between the memory gate electrode MG and the control gate electrode CG.

The control gate electrode CG and the memory gate electrode MG are extended along the main surface 1a of the semiconductor substrate 1 and disposed side by side between their opposed side surfaces to each other, that is, between their sidewalls, via the gate insulating film GIm. Each extending direction of the control gate electrode CG and the memory gate electrode MG is a direction perpendicular to the drawing sheet of FIG. 1 (Y-axis direction of FIG. 1). The control gate electrode CG is formed via the gate insulating film GIc on the p-type well PW, i.e., on the semiconductor substrate 1 in a portion positioned between the semiconductor region MD and the semiconductor region MS. The memory gate electrode MG is formed via the gate insulating film GIm on the p-type well PW, i.e., on the semiconductor substrate 1 in a portion positioned between the semiconductor region MD and the semiconductor region MS. The memory gate electrode MG is arranged closer to the semiconductor region MS, and the control gate electrode CG is arranged closer to the semiconductor region MD. The control gate electrode CG, the gate insulating film GIc, the memory gate electrode MG, and the gate insulating film GIm form the memory cell MC, i.e., a memory serving as a nonvolatile memory.

The control gate electrode CG and the memory gate electrode MG are adjacent to each other across the gate insulating film GIm, and the memory gate electrode MG is formed in a sidewall spacer form on the side surface, i.e., on the sidewall of the control gate electrode CG via the gate insulating film GIm. The gate insulating film GIm is formed between the memory gate electrode MG and the semiconductor substrate 1, i.e., the p-type well PW and between the memory gate electrode MG and the control gate electrode CG.

The gate insulating film GIc formed between the control gate electrode CG and the p-type well PW functions as a gate insulating film of the control transistor CT. The gate insulating film GIm formed between the memory gate electrode MG and the p-type well PW functions as a gate insulating film of the memory transistor MT.

In the specification of the present application, note that, for example, the phrase "the memory gate electrode MG is formed on the side surface, i.e., the sidewall of the control gate electrode CG" means that the memory gate electrode MG is formed on the side surface, i.e., on the sidewall of the control gate electrode CG. In the specification of the present application, for example, the phrase "the memory gate electrode MG is formed on the side surface of the control gate electrode CG" means that the memory gate electrode MG is formed in contact with the side surface of the control gate electrode CG or the memory gate electrode MG is formed on the opposite side to the control gate electrode CG across the side surface of the control gate electrode CG.

The gate insulating film GIc is formed of an insulating film 3. The insulating film 3 is formed of a silicon oxide film, a silicon nitride film, or a silicon oxynitride film or a high-dielectric-constant film having a higher specific dielectric constant than that of the silicon nitride film, i.e., a so-called High-k film. In the present application, note that the term "a High-k film or a high-dialectic-constant film" means a film having a higher dielectric constant (specific permittivity) than that of silicon nitride. As insulating film 3, a metal oxide film can be used, such as a hafnium oxide film, a zirconium oxide film, an aluminum oxide film, a tantalum oxide film, or a lanthanum oxide film.

The gate insulating film GIm is formed of an insulating film 8. The insulating film 8 is formed of, for example, a stacked film including a silicon oxide film 8a, a silicon nitride film 8b serving as a charge accumulating portion on the silicon oxide film 8a, and a silicon oxide film 8c on the silicon nitride film 8b.

Note that the gate insulating film GIm between the memory gate electrode MG and the p-type well PW functions as a gate insulating film of the memory transistor MT as described above. On the other hand, the gate insulating film GIm between the memory gate electrode MG and the control gate electrode CG functions as an insulating film for insulating, i.e., electrically isolating the memory gate electrode MG and the control gate electrode CG.

The silicon nitride film 8b of the insulating film 8 is an insulating film for storing charges, and functions as a charge accumulating portion. That is, the silicon nitride film 8b is a trap insulating film formed in the insulating film 8. Thus, the insulating film 8 can be regarded as an insulating film having a charge accumulating portion therein.

Each of the silicon oxide film 8c and the silicon oxide film 8a positioned above and below the silicon nitride film 8b can function as a charge block layer for trapping charges inside. By providing a configuration in which the silicon nitride film 8b is sandwiched between the silicon oxide film 8c and the silicon oxide film 8a, charges can be stored in the silicon nitride film 8b. The silicon oxide film 8a, the silicon nitride film 8b, and the silicon oxide film 8c can also be regarded as an ONO (Oxide-Nitride-Oxide) film.

The control gate electrode CG is formed of a conductive film 4. The conductive film 4 is made of silicon, and is formed of, for example, an n-type polysilicon film that is a polycrystalline silicon film to which an n-type impurity is introduced. More specifically, the control gate electrode CG is formed of the patterned conductive film 4.

The memory gate electrode MG is formed of a conductive film 9. The conductive film 9 is made of silicon, and is formed of, for example, an n-type polysilicon film that is a polycrystalline silicon film to which an n-type impurity is introduced. The memory gate electrode MG is formed by anisotropically etching, i.e., etching back the conductive film 9 formed so as to cover the control gate electrode CG on the semiconductor substrate 1, and making the conductive film 9 remain on the sidewall of the control gate electrode CG via the insulating film 8. Thus, the memory gate electrode MG is formed in a sidewall spacer form on the sidewall of the control gate electrode CG via the insulating film 8.

The cap insulating film CP1 is formed of an insulating film 5 containing silicon and oxygen, and the cap insulating film CP2 is formed of an insulating film 6 containing silicon and nitrogen. Each of the cap insulating films CP1 and CP2 is a protective film for protecting the control gate electrode CG and a hard mask film used when the conductive film 4 is patterned to form the control gate electrode CG. Alternatively, each of the cap insulating films CP1 and CP2 is a cap film for adjusting a height of each upper surface of the memory gate electrodes MG when the conductive film 9 is etched back to form the memory gate electrode MG.

The length of the cap insulating film CP2 in the X-axis direction, i.e., a gate length direction may be shorter than the length of the control gate electrode CG in the X-axis direction, i.e., the gate length direction. Thus, an area of a metal silicide layer formed on an upper surface of the memory gate electrode MG can be increased. In the specification of the present application, note that, for example, the gate length of the control gate electrode CG means the length of the control gate electrode CG in a direction (the X-axis direction illustrated in FIG. 1) intersecting, more preferably perpendicular to a direction (the Y-axis direction illustrated in FIG. 1) in which the control gate electrode CG extends.

The semiconductor region MS is a semiconductor region functioning as either one of a source region and a drain region, and the semiconductor region MD is a semiconductor region functioning as the other one of the source region and the drain region. Here, the semiconductor region MS is a semiconductor region functioning as, for example, the source region, and the semiconductor region MD is a semiconductor region functioning as, for example, the drain region. Each of the semiconductor regions MS and MD is formed of a semiconductor region to which an n-type impurity is introduced, and has an LDD (Lightly doped drain) structure.

The source semiconductor region MS includes an $n^-$-type semiconductor region 11a and an $n^+$-type semiconductor region 12a having a higher impurity concentration than that of the $n^-$-type semiconductor region 11a. The drain semiconductor region MD includes an $n^-$-type semiconductor region 11b and an $n^+$-type semiconductor region 12b having a higher impurity concentration than that of the $n^-$-type semiconductor region 11b.

The $n^+$-type semiconductor region 12a has a larger junction depth and a higher impurity concentration than those of the $n^-$-type semiconductor region 11a, and the $n^+$-type semiconductor region 12b has a larger junction depth and a higher impurity concentration than those of the $n^-$-type semiconductor region 11b.

Sidewall spacers SW each formed of an insulating film such as a silicon oxide film, a silicon nitride film, or their stacked film are formed on sidewalls of the memory gate electrode MG and the control gate electrode CG, the sidewalls being not adjacent to each other. The sidewall spacer SW is formed in a portion on the opposite side to the memory gate electrode MG across the control gate electrode CG, the portion being also adjacent to the control gate electrode CG. And, the sidewall spacer SW is formed in a portion on the opposite side to the control gate electrode CG across the memory gate electrode MG, the portion being also adjacent to the memory gate electrode MG.

As illustrated in FIG. 1, note that an insulating film SIF made of, for example, silicon oxide may be interposed between the control gate electrode CG and the sidewall spacer SW and between the memory gate electrode MG and the sidewall spacer SW.

The $n^-$-type semiconductor region 11a is formed to be self-aligned with the side surface of the memory gate electrode MG, and the $n^+$-type semiconductor region 12a is formed to be self-aligned with the side surface of the sidewall spacer SW on the side surface of the memory gate electrode MG. Thus, the $n^-$-type semiconductor region 11a having a low concentration is formed below the sidewall spacer SW on the side surface of the memory gate electrode MG, and the $n^+$-type semiconductor region 12a having a high concentration is formed outside the $n^-$-type semiconductor region 11a having a low concentration. Therefore, the $n^+$-type semiconductor region 12a having a high concentration is formed to contact the $n^-$-type semiconductor region 11a having a low concentration.

The $n^-$-type semiconductor region 11b is formed to be self-aligned with the side surface of the control gate electrode CG, and the $n^+$-type semiconductor region 12b is formed to be self-aligned with the side surface of the sidewall spacer SW on the side surface of the control gate electrode CG. Thus, the $n^-$-type semiconductor region 11b having a low concentration is formed below the sidewall spacer SW on the side surface of the control gate electrode CG, and the $n^+$-type semiconductor region 12b having a high concentration is formed outside the $n^-$-type semiconductor region 11b having a low concentration. Therefore, the $n^+$-type semiconductor region 12b having a high concentration is formed to contact the $n^-$-type semiconductor region 11b having a low concentration. As described with reference to FIG. 27 described below, note that the two adjacent memory cells MC share the $n^+$-type semiconductor region 12b having a high concentration.

A channel region of the control transistor CT is formed in an upper layer portion of the p-type well PW in a portion positioned below the gate insulating film GIc below the control gate electrode CG.

An n⁻-type semiconductor region VMG is formed in an upper layer portion of the p-type well PW in a portion positioned below the gate insulating film GIm below the memory gate electrode MG. The n⁻-type semiconductor region VMG is used to adjust a threshold voltage Vth of the memory transistor MT, and is formed to contact the n⁻-type semiconductor region 11a. The concentration of n-type impurities in the n⁻-type semiconductor region VMG is lower than the concentration of n-type impurities in the n⁻-type semiconductor region 11a.

A metal silicide layer 13 is formed on each of the n⁺-type semiconductor regions 12a and 12b, i.e., on an upper surface of each of the n⁺-type semiconductor regions 12a and 12b by using a Salicide (Self Aligned Silicide) technique or others. The metal silicide layer 13 is formed of, for example, a cobalt silicide layer, a nickel silicide layer, or a platinum-added nickel silicide layer. By the metal silicide layer 13, a diffusion resistance and a contact resistance can be reduced. Note that the metal silicide layer 13 may be formed on the memory gate electrode MG.

An insulating film 14 is formed on the semiconductor substrate 1 to cover the control gate electrode CG, the cap insulating film CP2, the memory gate electrode MG, and each of the sidewall spacers SW. The insulating film 14 is formed of, for example, a silicon nitride film or others.

An interlayer insulating film 15 is formed on the insulating film 14. The interlayer insulating film 15 is formed of a single film of a silicon oxide film, a stacked film of a silicon nitride film and a silicon oxide film, or others. An upper surface of the interlayer insulating film 15 is flattened. As described below with reference to FIG. 27, note that a contact hole CNT may be formed in the interlayer insulating film 15, and that a conductive plug PG may be embedded as a conductor section in the contact hole CN.

In the present embodiment, the active region AR serving as a region closer to the main surface 1a includes regions AR1 to AR3. That is, the semiconductor substrate 1 includes regions AR1 to AR3 each serving as a region closer to the main surface 1a. The region AR2 is arranged closer to the positive side in the X-axis direction than the region AR1, and is arranged adjacent to the region AR1 in a plan view, and the region AR3 is arranged between the region AR1 and the region AR2.

The control gate electrode CG is formed on an upper surface TS1 of the region AR1. The memory gate electrode MG and the sidewall spacer SW on the side surface of the memory gate electrode MG are formed on an upper surface TS2 of the region AR2. A gate insulating film GIm is formed between the memory gate electrode MG and the control gate electrode CG and between the memory gate electrode MG and the upper surface TS2. The n⁻-type semiconductor region 11a and the n⁺-type semiconductor region 12a are formed in an upper layer portion of the region AR2.

The upper surface TS2 of the region AR2 is lower than the upper surface TS1 of the region AR1. That is, the upper surface TS2 of the region AR2 is arranged closer to the main surface 1b than the upper surface TS1 of the region AR1 in the Z-axis direction.

The region AR3 has a connection surface TS3 connecting the upper surface TS1 of the region AR1 and the upper surface TS2 of the region AR2. The gate insulating film GIm is also formed between the memory gate electrode MG and the connection surface TS3. That is, the gate insulating film GIm is formed on the connection surface TS3 and on the upper surface TS2.

An end EP1 of the connection surface TS3 is connected to the upper surface TS2 of the region AR2, and an end EP2 of the connection surface TS3 which is on the opposite side to the end EP1 is connected to the upper surface TS1 of the region AR1. The end EP1 of the connection surface TS3 is arranged closer to the positive side in the X-axis direction than the end EP2 of the connection surface TS3 in the X-axis direction, and is arranged lower than the end EP2 of the connection surface TS3, i.e., closer to the main surface 1b than the end EP2 in the Z-axis direction. In other words, the connection surface TS3 is inclined with respect to both the upper surface TS2 and a YZ plane, i.e., a plane perpendicular to the X-axis direction so that the end EP1 is positioned closer to the positive side than the end EP2 in the X-axis direction and is positioned lower than the end EP2 in the Z-axis direction.

Thus, as described with reference to FIGS. 1 to 4 and FIGS. 28 and 29 described below, a distribution of electrons injected into the gate insulating film GIm when data is written and a distribution of holes injected into the gate insulating film GIm when data is erased are close to or become the same as each other.

In the specification of the present application, note that the upper surface TS1 of the region AR1 is defined to be the same surface as the main surface 1a of the semiconductor substrate 1.

The active region AR serving as a region closer to the main surface 1a includes regions AR4 and AR5. That is, the semiconductor substrate 1 includes regions AR4 and AR5 each serving as a region closer to the main surface 1a. The region AR4 is arranged closer to the negative side in the X-axis direction, i.e., closer to the opposite side to the positive side in the X-axis direction than the region AR1 and is adjacent to the region AR1 in a plan view, and the region AR5 is arranged between the region AR1 and the region AR4.

The sidewall spacer SW on the side surface of the control gate electrode CG is formed on an upper surface TS4 of the region AR4. The n⁻-type semiconductor region 11b and the n⁺-type semiconductor region 12b are formed in an upper layer portion of the region AR4.

The upper surface TS4 of the region AR4 is lower than the upper surface TS1 of the region AR1. That is, the upper surface TS4 of the region AR4 is arranged closer to the main surface 1b than the upper surface TS1 of the region AR1 in the Z-axis direction.

The region AR5 has a connection surface TS5 connecting the upper surface TS1 of the region AR1 and the upper surface TS4 of the region AR4. An end EP3 of the connection surface TS5 is connected to the upper surface TS4 of the region AR4, and an end EP4 of the connection surface TS5 which is on the opposite side to the end EP3 is connected to the upper surface TS1 of the region AR1. The end EP3 of the connection surface TS5 is arranged closer to the negative side than the end EP4 of the connection surface TS5 in the X-axis direction, and is arranged lower than the end EP4 of the connection surface TS5, i.e., closer to the main surface 1b than the end EP4 in the Z-axis direction. In other words, the connection surface TS5 is inclined with respect to both the upper surface TS4 and the ZY plane so that the end EP3 is positioned closer to the negative side than the end EP4 in the X-axis direction and is positioned lower than the end EP4 in the Z-axis direction.

Preferably, the upper surface TS2 of the region AR2 is lower than the upper surface TS4 of the region AR4. That is, the upper surface TS2 of the region AR2 is arranged closer to the main surface 1b than the upper surface TS4 of the region AR4 in the Z-axis direction. Thus, the upper surface TS4 of the region AR4 can be arranged at almost the same height as that of the upper surface TS1 of the region AR1. Therefore, the distributions of the n⁻-type semiconductor region 11b and the n⁺-type semiconductor region 12b are not different from each other so much in comparison with a state in which the upper surface TS4 of the region AR4 is arranged at a height equal to that of the upper surface TS1 of the region AR1. Therefore, decrease in an on-state current flowing through the control transistor CT can be prevented or suppressed.

As illustrated in FIG. 2, an angle made by the connection surface TS3 and the upper surface TS2 is defined as an angle ANS1 serving as an acute angle. At this time, an obtuse angle between the connection surface TS3 and the upper surface TS2 is represented by an angle ANL1. The sum of the angle ANS1 and the angle ANL1 is equal to 180°. If the connection surface TS3 is inclined as described above, the angle ANS1 is larger than 0° and smaller than 90°. In other words, the angle ANL1 is smaller than 180° and larger than 90°.

An angle made by the connection surface TS5 and the upper surface TS4 is defined as an angle ANS2 serving as an acute angle. At this time, an obtuse angle between the connection surface TS5 and the upper surface TS4 is represented by an angle ANL2. The sum of the angle ANS2 and the angle ANL2 is equal to 180°.

Preferably, the angle ANS1 serving as an acute angle made by the connection surface TS3 and the upper surface TS2 is larger than the angle ANS2 serving as an acute angle made by the connection surface TS5 and the upper surface TS4. Thus, the upper surface TS4 of the region AR4 can also be arranged at almost the same height as that of the upper surface TS1 of the region AR1. Therefore, the distributions of the n⁻-type semiconductor region 11b and the n⁺-type semiconductor region 12b are not different from each other so much in comparison with a state in which the upper surface TS4 of the region AR4 is arranged at a height equal to that of the upper surface TS1 of the region AR1. Therefore, decrease in an on-state current flowing through the control transistor CT can be prevented or suppressed.

As illustrated in FIG. 3, in some cases, note that a corner is not be formed between a portion of the connection surface TS3 which is closer to the upper surface TS2 and a portion of the upper surface TS2 which is closer to the connection surface TS3 so that the portion of the connection surface TS3 which is closer to the upper surface TS2 and the portion of the upper surface TS2 which is closer to the connection surface TS3 form the same curved surface. In such a case, an angle made by a virtual plane TS31 formed by extending a portion of the connection surface TS3 which is closer to the upper surface TS1 toward the upper surface TS2 as the same plane and a virtual plane TS21 formed by extending a portion of the upper surface TS2 which is on the opposite side to the connection surface TS3 toward the connection surface TS3 as the same plane is defined as the angle ANS1 serving as an acute angle. At this time, the angle ANL1 is an obtuse angle between the plane TS31 and the plane TS21, and is an angle set so that the sum of the angle ANS1 and the angle ANL1 becomes equal to 180°. An end EP11 of the plane TS31 which is on the opposite side to the end EP2 is connected to the plane TS21.

Although illustration thereof is omitted in FIG. 3, in some cases, a corner is not be formed between a portion of the connection surface TS5 which is closer to the upper surface TS4 and a portion of the upper surface TS4 which is closer to the connection surface TS5 so that the portion of the connection surface TS5 which is closer to the upper surface TS4 and the portion of the upper surface TS4 which is closer to the connection surface TS5 form the same curved surface. As similar to the case of the connection surface TS3 and the upper surface TS2 also in this case, an angle made by a virtual plane formed by extending a portion of the connection surface TS5 which is closer to the upper surface TS1 toward the upper surface TS4 as the same plane and a virtual plane formed by extending a portion of the upper surface TS4 which is on the opposite side to the connection surface TS5 toward the connection surface TS5 as the same plane is defined as the angle ANS2 serving as an acute angle. At this time, the angle ANL2 is an obtuse angle between the respective virtual planes, and is an angle set so that the sum of the angle ANS2 and the angle ANL2 becomes equal to 180°.

As illustrated in FIGS. 3 and 4, the memory gate electrode MG includes an electrode portion MG1 formed on the upper surface TS2 and an electrode portion MG2 formed closer to the control gate electrode CG than the electrode portion MG1. The electrode portion MG2 has a connection surface BS2 serving as a lower surface connecting the lower surface BS1 of the electrode portion MG1 and the side surface BS3 of the electrode portion MG2 which is closer to the control gate electrode CG. As illustrated in FIG. 4, an end EP5 of the connection surface BS2 of the electrode portion MG2 is connected to the lower surface BS1 of the electrode portion MG1, and an end EP6 of the connection surface BS2 of the electrode portion MG2 which is on the opposite side to the end EP5 is connected to the side surface BS3 of the electrode portion MG2. The end EP5 is arranged closer to the positive side than the end EP6 in the X-axis direction, and is arranged lower than the end EP6 in the Z-axis direction.

A corner AP1 is formed by the lower surface BS1 and the connection surface BS2, and a corner AP2 is formed by the connection surface BS2 and the side surface BS3.

As illustrated in FIG. 3, in some cases, note that a corner is not be formed between a portion of the connection surface BS2 which is closer to the lower surface BS1 and a portion of the lower surface BS1 which is closer to the connection surface BS2 so that the portion of the connection surface BS2 which is closer to the lower surface BS1 and the portion of the lower surface BS1 which is closer to the connection surface BS2 form the same curved surface. In this case, an angle made by a virtual plane BS21 formed by extending a portion of the connection surface BS2 which is closer to the side surface BS3 toward the lower surface BS1 as the same plane and a virtual plane BS11 formed by extending a portion of the lower surface BS1 which is on the opposite side to the connection surface BS2 toward the connection surface BS2 as the same plane is defined as the angle ANS1 serving as an acute angle. At this time, the angle ANL1 is an obtuse angle between the plane BS21 and the plane BS11, and is an angle set so that the sum of the angle ANS1 and the angle ANL1 becomes equal to 180°. An end EP51 of the plane BS21 which is on the opposite side to the end EP6 is connected to the plane BS11. And, FIG. 3 illustrates a region RG2 surrounded by a dashed-two dotted line so as to be enlarged.

Next, an operation of the memory cell MC will be described. In the present embodiment, the injection of electrons into the silicon nitride film 8b serving as a charge accumulating portion in the insulating film 8 in the memory transistor is defined as "writing", and the injection of holes thereto is defined as "erasure". Further, a power supply voltage Vdd is set to 1.5 V.

As a writing system, hot electron writing referred to as a so-called Source Side Injection (SSI) system can be used. At this time, a voltage Vd applied to the semiconductor region MD is set to, for example, about the power supply voltage Vdd, a voltage Vcg applied to the control gate electrode CG is set to, for example, about 1 V, and a voltage Vmg applied to the memory gate electrode MG is set to, for example, about 12 V. A voltage Vs applied to the semiconductor region MS is set to, for example, about 6 V, and a voltage Vb applied to the p-type well PW is set to, for example, about 0 V. Each of the above-described voltages is applied to each portion of the memory cell MC to which data is written.

Thus, as indicated by an arrow ELA in FIG. 4, electrons EL are injected into the silicon nitride film 8b in the gate insulating film GIm in the memory call MC so that data is written into the memory cell MC.

Hot electrons are mainly generated in a channel region in a portion positioned below the memory gate electrode MG via the gate insulating film GIm, and are injected into the silicon nitride film 8b serving as a charge accumulating portion in the gate insulating film GIm. The injected hot electrons are trapped at a trap level in the silicon nitride film 8b in the gate insulating film GIm. As a result, a threshold voltage of the memory transistor rises.

As an erasure method, a system for performing the erasure by injecting holes serving as hot holes by a Band-To-Band Tunneling (BTBT) phenomenon can also be used. However, it is preferable to use an erasure system by hole injection using a direct tunneling phenomenon, i.e., a Fowler-Nordheim (FN) tunneling phenomenon. When the FN tunneling phenomenon is used, the erasure is performed by injecting holes into the charge accumulating portion, i.e., the silicon nitride film 8b in the gate insulating film G1 by the direct tunneling phenomenon. At this time, the voltage Vd is set to, for example, about 0 V, the voltage Vcg is set to, for example, about 0 V, the voltage Vmg is set to, for example, about 12 V, the voltage Vs is set to, for example, about 0 V, and the voltage Vb is set to, for example, about 0 V. Each of the above-described voltages is applied to each portion of the memory cell MC from which data is erased.

Thus, as indicated by an arrow HLA in FIG. 4, holes HL are injected from the memory gate electrode MG into the charge accumulating portion, i.e., the silicon nitride film 8b via the silicon oxide film 8c by the direct tunneling phenomenon so as to cancel the electrons in the silicon nitride film 8b, so that the erasure is performed. Alternatively, by trapping the holes injected into the silicon nitride film 8b at the trap level in the silicon nitride film 8b, the erasure is performed. Thus, a threshold voltage of the memory transistor drops so that the memory transistor is brought to an erasure state.

When the erasure method based on such an FN tunneling phenomenon is used, a consumption current can be more reduced and a property of the memory cell can be more improved than those when the erasure method based on the BTBT phenomenon is used. When the gate length of the memory gate electrode MG decreases as the nonvolatile memory is finely formed, the case of the usage of the erasure method based on the FN-type tunneling phenomenon has more significantly an effect of reducing the consumption current and improving the property of the memory cell than the case of the usage of the erasure method based on the BTBT phenomenon.

At the time of reading, the voltage Vd is set to, for example, about the power supply voltage Vdd, the voltage Vcg is set to, for example, about the power supply voltage Vdd, the voltage Vmg is set to, for example, about 0 V, the voltage Vs is set to, for example, about 0 V, and the voltage Vb is set to, for example, about 0 V. Each of the above-described voltages is applied to each portion of the memory cell MC from which data is read. The writing state and the erasure state can be distinguished from each other by setting the voltage Vmg applied to the memory gate electrode MG at the time of reading between a threshold voltage of the memory transistor in the writing state and a threshold voltage of the memory transistor in the erasure state.

<Method for Manufacturing Semiconductor Device>

Figure 5:
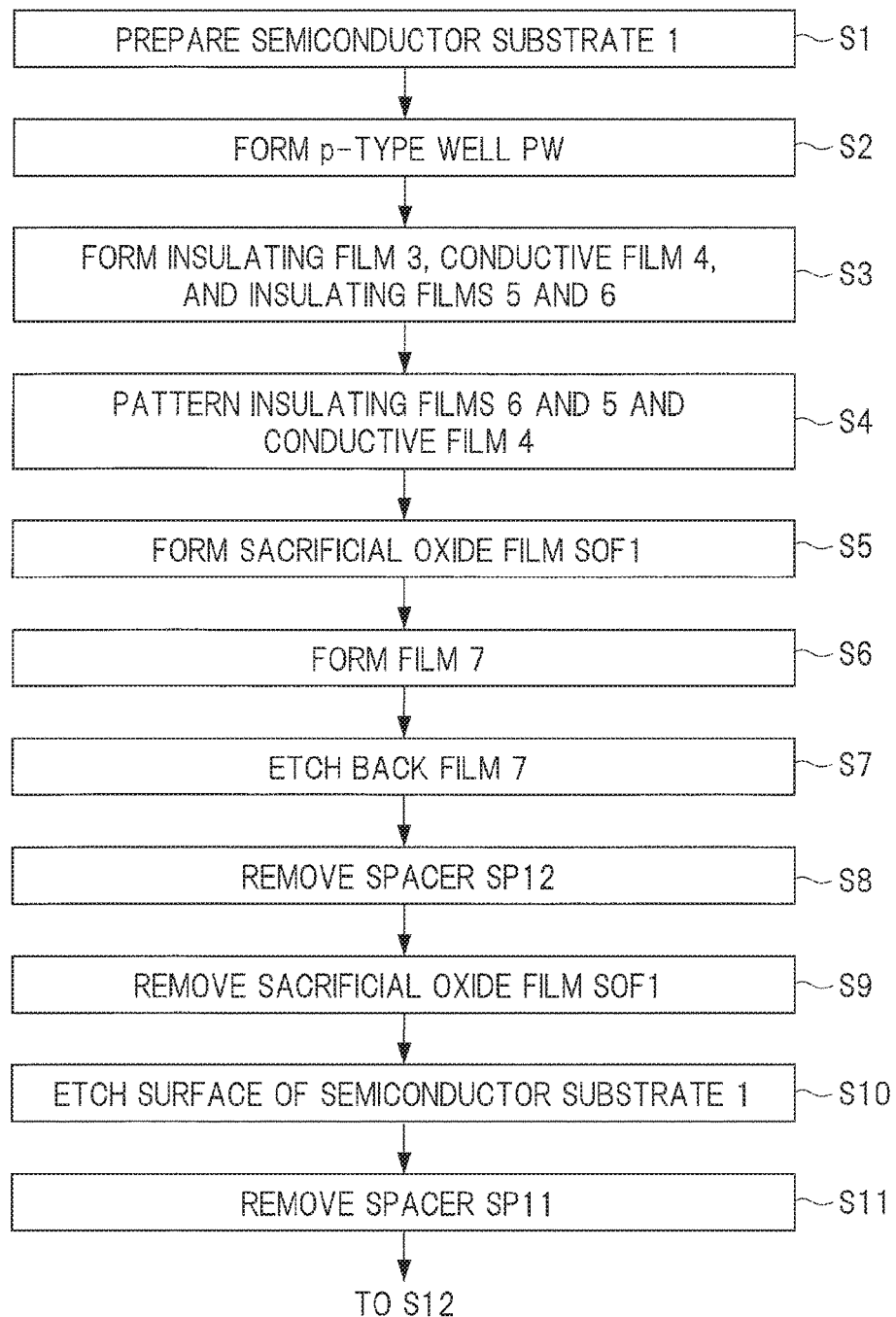
FIG. 5 is a process flowchart showing a part of a manufacturing process of the semiconductor device according to an embodiment.
Figure 6:
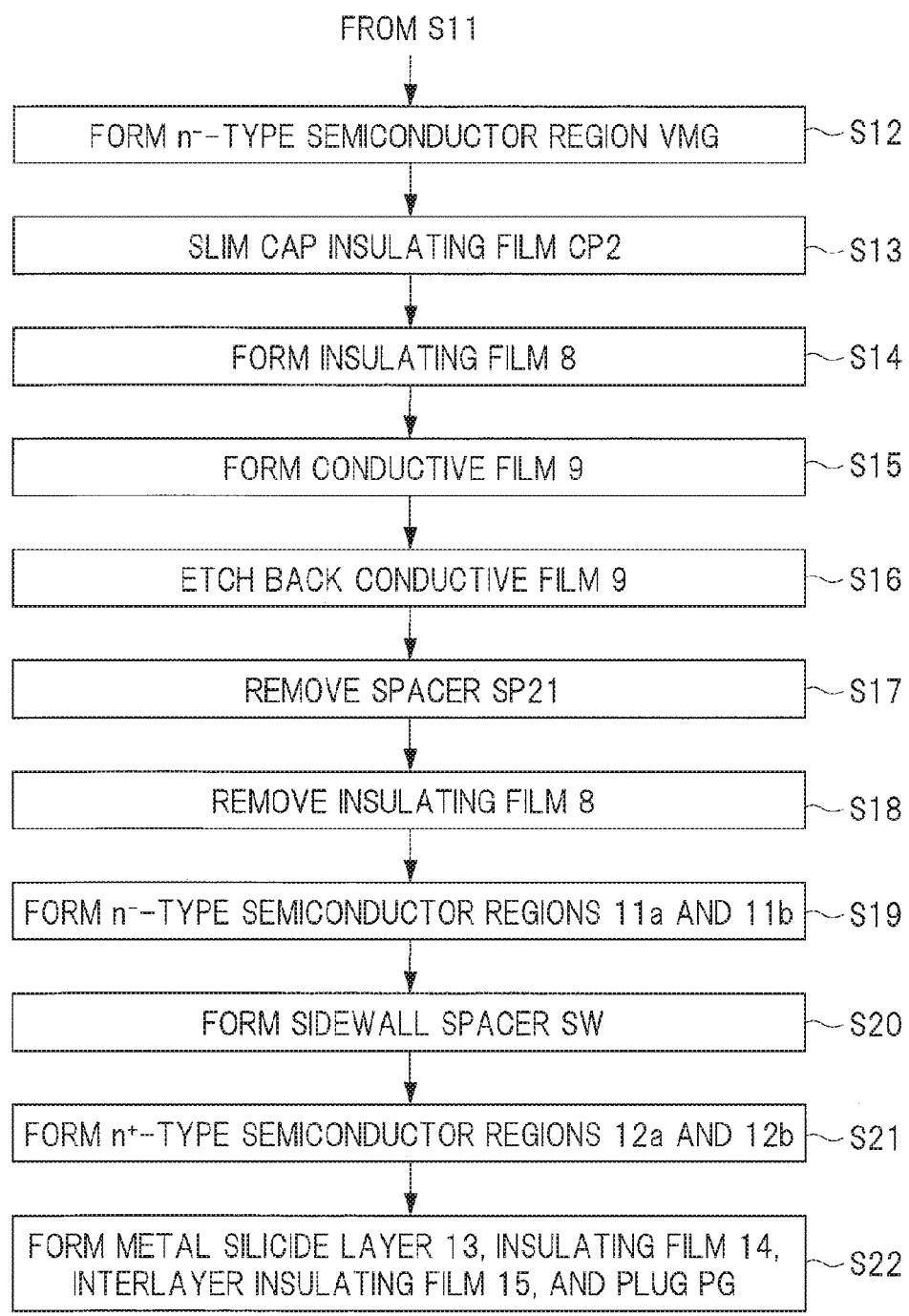
FIG. 6 is a process flow showing a part of a manufacturing process of a semiconductor device according to an embodiment.

Next, a method for manufacturing the semiconductor device according to the present embodiment will be described. FIGS. 5 and 6 are process flowcharts each illustrating a part of processes for manufacturing the semiconductor device according to the embodiment. Each of FIGS. 7 to 27 is a cross-sectional view of a principal part during a process for manufacturing the semiconductor device according to the embodiment.

FIGS. 7 to 27 are cross-sectional views each illustrating manufacturing processes for forming memory cells MC1 and MC2 serving as two memory cells MC illustrated in FIG. 27. While an arrangement in the memory cell MC1 out of the two memory cells MC1 and MC2 is the same as an arrangement in the memory cell MC illustrated in FIG. 1, right and left of an arrangement in the memory cell MC2 are switched from the arrangement of the memory cell MC1. That is, the memory cells MC1 and MC2 are arranged so as to be symmetrical with each other across a YZ plane between the memory cell MC1 and the memory cell MC2. Hereinafter, manufacturing processes for mainly forming the memory cell MC1 out of the two memory cells MC1 and MC2 will be described.

In the present embodiment, a case of formation of a control transistor CT and a memory transistor MT of an n-channel type will be described. However, a control transistor CT and a memory transistor MT of a p-channel type can also be formed by reversing the conductivity type.

Figure 7:
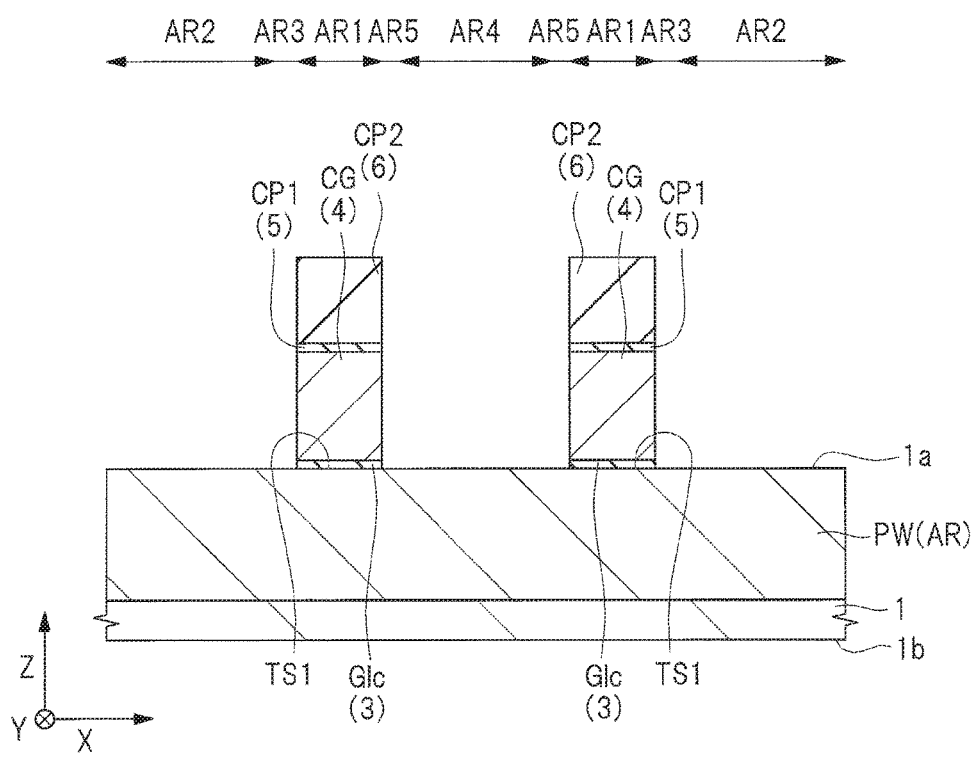
FIG. 7 is a cross-sectional view of a principal part during a manufacturing process of a semiconductor device according to an embodiment.

As illustrated in FIG. 7, first, a semiconductor substrate serving as a semiconductor wafer formed of p-type single-crystalline silicon having a specific resistance of, for example, about 1 to 10 Ωcm is prepared (step S1 illustrated in FIG. 5). The semiconductor substrate 1 has a main surface 1a and a main surface 1b on the opposite side to the main surface 1a.

The semiconductor substrate 1 has an active region AR serving as a region closer to the main surface 1a. The active region AR is defined, i.e., partitioned by an element isolation region (illustration is omitted), and is electrically isolated from another active region by the element isolation region. A p-type well PW is formed in the active region AR. The p-type well PW has a p-type conductivity.

In the present embodiment, the active region AR serving as a region closer to the main surface 1a includes regions AR1 to AR5. That is, in the step S1, the semiconductor substrate 1 including regions AR1 to AR5 each serving as regions closer to the main surface 1a is prepared. In a region where the memory cell MC1 (see FIG. 27 described below), the region AR2 is arranged closer to the positive side than the region AR1 in the X-axis direction, and is adjacent to the region AR1 in a plan view, and the region AR3 is arranged between the region AR1 and the region AR2. The region AR4 is arranged closer to the negative side in the X-axis direction, i.e., closer to the opposite side to the positive side in the X-axis direction than the region AR1, and is adjacent to the region AR1 in a plan view, and the region AR5 is arranged between the region AR1 and the region AR4.

Next, as illustrated in FIG. 7, the p-type well PW is formed in the active region AR (step S2 illustrated in FIG. 5). The p-type well PW can be formed by introducing p-type impurities such as boron (B) into the semiconductor substrate 1 using an ion implantation method or others. The p-type well PW is formed over a predetermined depth from the main surface 1a of the semiconductor substrate 1.

Next, a natural oxide film on a surface of the semiconductor substrate 1 is removed by wet etching or others using, for example, a hydrofluoric acid (HF) solution, and the surface of the semiconductor substrate 1 is washed, so that the surface of the semiconductor substrate 1 is cleaned. Thus, the surface of the semiconductor substrate 1, i.e., a surface of the p-type well PW is exposed.

Next, as illustrated in FIG. 7, an insulating film 3, a conductive film 4, and insulating films 5 and 6 are then formed on the entire main surface 1a of the semiconductor substrate 1 (step S3 illustrated in FIG. 5).

In step S3, as illustrated in FIG. 7, first, the insulating film 3 is formed on the main surface 1a of the semiconductor substrate 1. As described above, a silicon oxide film, a silicon nitride film, or a silicon oxynitride film, or a High-k film, i.e., a high-dielectric-constant film can be used as the insulating film 3, and an example of a material that is usable as the insulating film 3 is as described above. The insulating film 3 can be formed by using a thermal oxidation method, a sputtering method, an Atomic Layer Deposition (ADL) method, a Chemical Vapor Deposition (CVD) method, or others.

In step S3, next, as illustrated in FIG. 7, the conductive film 4 is formed on the entire main surface 1a of the semiconductor substrate 1, i.e., on the insulating film 3.

Preferably, the conductive film 4 is formed of a silicon film such as a polycrystalline silicon film, i.e., a polysilicon film. Such a conductive film 4 can be formed by using a CVD method or others. A thickness of the conductive film 4 can be as sufficiently large enough as covering the insulating film 3. After the conductive film 4 is formed as an amorphous silicon film at the time of film formation, the amorphous silicon film can also be formed as a polycrystalline silicon film in subsequent heat treatment.

As the conductive film 4, it is preferable to use a material having a low resistivity made by introducing, for example, n-type impurities such as phosphorous (P) or arsenic (As) or p-type impurities such as boron (B). The impurities can be introduced at the time of or after the formation of the conductive film 4. If the impurities are introduced at the time of the formation of the conductive film 4, the conductive film 4 to which the impurities have been introduced can be formed by containing doping gas in gas for forming the conductive film 4. On the other hand, if the impurities are introduced after the formation of the silicon film, the conductive film 4 to which the impurities have been introduced can be formed by introducing the impurities into the silicon film using an ion implantation method or others after the formation of the silicon film without intentionally introducing the impurities.

In step S3, next, as illustrated in FIG. 7, the insulating film 5 is formed on the entire main surface 1a of the semiconductor substrate 1, i.e., on the conductive film 4.

The insulating film 5 formed of a silicon oxide film can be formed by, for example, thermal oxidation of a surface of the conductive film 4 formed of the silicon film. Alternatively, the insulating film 5 formed of a silicon oxide film can also be formed by using a CVD method instead of the thermal oxidation of the surface of the conductive film 4 formed of the silicon oxide film.

As a material for the insulating film 5, an insulating film made of another material can be used instead of a silicon oxide film. Alternatively, the insulating film 6 can also be directly formed on the conductive film 4 without the insulating film 5 being formed.

In step S3, next, as illustrated in FIG. 7, the insulating film 6 containing silicon and nitrogen is formed on the entire main surface 1a of the semiconductor substrate 1, i.e., on the insulating film 5. The insulating film 6 formed of, for example, a silicon nitride film can be formed by using, for example, a CVD method.

Next, as illustrated in FIG. 7, the insulating films 6 and 5 and the conductive film 4 are patterned (step S4 illustrated in FIG. 5). In step S4, the insulating films 6 and 5 and the conductive film 4 are patterned by using, for example, photolithography and etching.

First, a resist film (illustration is omitted) is formed on the insulating film 6. Then, an opening portion, which penetrates the resist film to reach the insulating film 6, is formed in a region other than a region where a control gate electrode CG is to be formed, and a resist pattern (illustration is omitted) formed of a resist film having the opening portion formed therein is formed.

At this time, the insulating film 6 in a portion arranged in the region where the control gate electrode CG is to be formed is covered with the resist film.

Then, the insulating films 6 and 5 and the conductive film 4 are etched by, for example, dry etching and are patterned while using the resist pattern as an etching mask.

Thus, the control gate electrode CG formed of the conductive film 4 is formed on the main surface 1a of the semiconductor substrate 1, and a gate insulating film GIc formed of the insulating film 3 between the control gate electrode CG and the semiconductor substrate 1 is formed between the control gate electrode CG and the semiconductor substrate 1. More specifically, the control gate electrode CG is formed on an upper surface TS1 of the region AR1.

A cap insulating film CP1 formed of the insulating film 5 in a portion formed on the control gate electrode CG is formed, and a cap insulating film CP2 formed of the insulating film 6 in a portion formed on the control gate electrode CG is formed via the cap insulating film CP1. Then, the resist pattern, i.e., the resist film is removed.

Note that the insulating film 3 in a portion, which is not covered with the control gate electrode CG, can be removed by performing dry etching in step S4 or performing wet etching after the dry etching in step S4. In a portion where the control gate electrode CG is not formed, the p-type well PW in the semiconductor substrate 1 is exposed.

Figure 8:
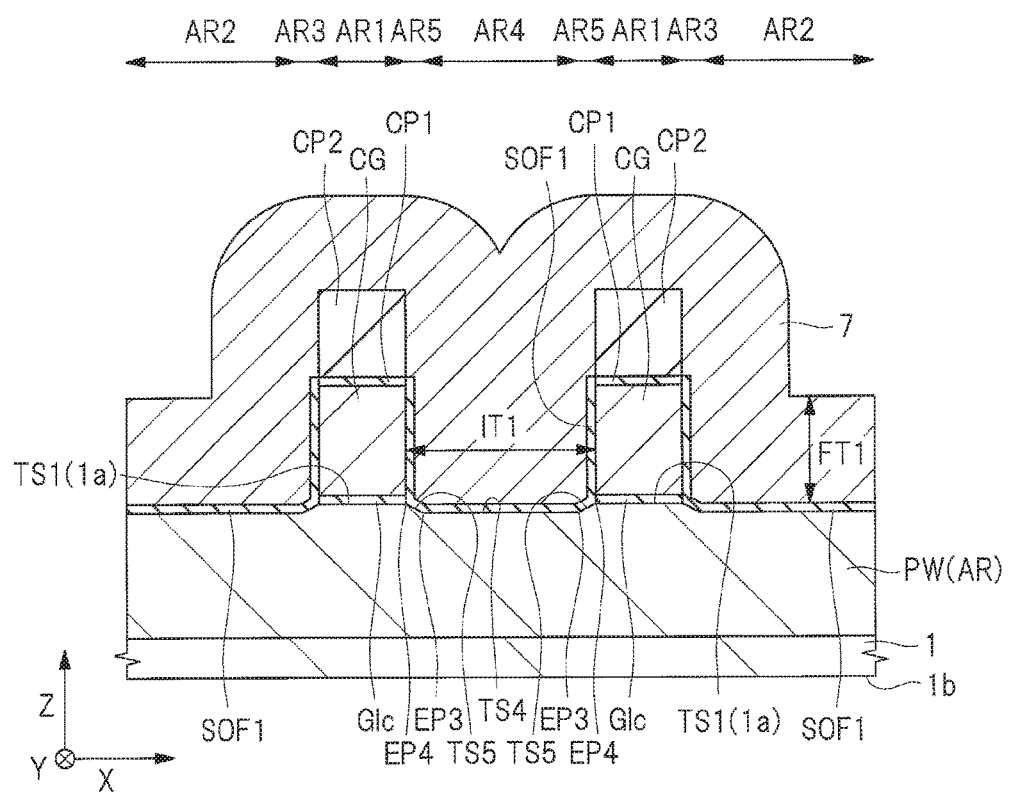
FIG. 8 is a cross-sectional view of a principal part during a manufacturing process of a semiconductor device according to an embodiment.

Next, as illustrated in FIG. 8, a sacrificial oxide film SOF1 is formed (step S5 illustrated in FIG. 5). In step S5, the main surface 1a of the semiconductor substrate 1 and a side surface of the control gate electrode CG are oxidized, so that the sacrificial oxide film SOF1 is formed. As described below with reference to FIG. 9, the sacrificial oxide film SOF1 is an etching stopper film used when the film 7 is etched. The sacrificial oxide film SOF1 can be formed by using a thermal oxidation method, an ISSG (In Situ Steam Generation) oxidation method, using both the thermal oxidation method and the ISSG oxidation method.

At this time, by oxidizing a surface of the region AR, an upper surface TS4 of the region AR4 is made lower than an upper surface TS1 of the region AR1. A connection surface TS5 connecting the upper surface TS1 of the region AR1 and the upper surface TS4 of the region AR4 is formed in the region AR5 arranged between the region AR1 and the region AR4.

When the sacrificial oxide film SOF1 is formed, oxygen is sufficiently supplied at the time of oxidation to a region such as the region AR4 not having an extremely nearby pattern, i.e., a region spaced apart from the control gate electrode CG. Therefore, a surface of the region AR4 is oxidized in almost a constant thickness. On the other hand, in the region AR5 adjacent to a pattern of the control gate electrode CG, the pattern of the control gate electrode CG exists on the semiconductor substrate 1. Therefore, an amount of the supply of oxygen at the time of oxidation is smaller as being closer to the control gate electrode CG than an amount thereof in the case not having the nearby pattern. Therefore, the progress of oxidation is delayed. Therefore, in the region AR5, the connection surface TS5 is formed so as to be inclined with respect to its end closer to the region AR4 to its end closer to the control gate electrode CG.

An end EP3 of the connection surface TS5 is connected to the upper surface TS4 of the region AR4, and an end EP4 of the connection surface TS5 which is on the opposite side to the end EP3 is connected to the upper surface TS1 of the region AR1. The end EP3 of the connection surface TS5 is arranged closer to the opposite side to the region AR2 than the end EP4 of the connection surface TS5 in the X-axis direction, and is arranged lower than the end EP4 of the connection surface TS5 in a Z-axis direction. In other words, the connection surface TS5 is inclined with respect to both the upper surface TS4 and the YZ plane so that the end EP3 is positioned closer to the opposite side to the region AR2 than the end EP4 in the X-axis direction, and is positioned lower than the end EP4 in the Z-axis direction.

Next, as illustrated in FIG. 8, a film 7 is formed on the semiconductor substrate 1 to cover the control gate electrode CG (step S6 illustrated in FIG. 5). As described above, the sacrificial oxide film SOF1 is an etching stopper film used when the film 7 is etched.

Preferably, the film 7 is formed of, for example, a silicon film such as a polycrystalline silicon film, i.e., a polysilicon film. Such a film 7 can be formed by using a CVD method or others. A thickness of the film 7 can be as sufficiently large enough as covering the insulating film 3. After the conductive film 4 is formed as an amorphous silicon film at the time of film formation, the amorphous silicon film can also be formed as a polycrystalline silicon film in subsequent heat treatment.

As described below with reference to FIG. 9, the thickness of the film 7 is preferably such a film thickness as to fill a space between two adjacent control gate electrodes CG even when the film 7 is etched back by only the film thickness of the film 7. Therefore, the film thickness FT1 of the film 7 is preferably, for example, equal to or larger than half of an interval IT1 between the respective opposed side surfaces of the adjacent control gate electrodes CG.

Figure 9:
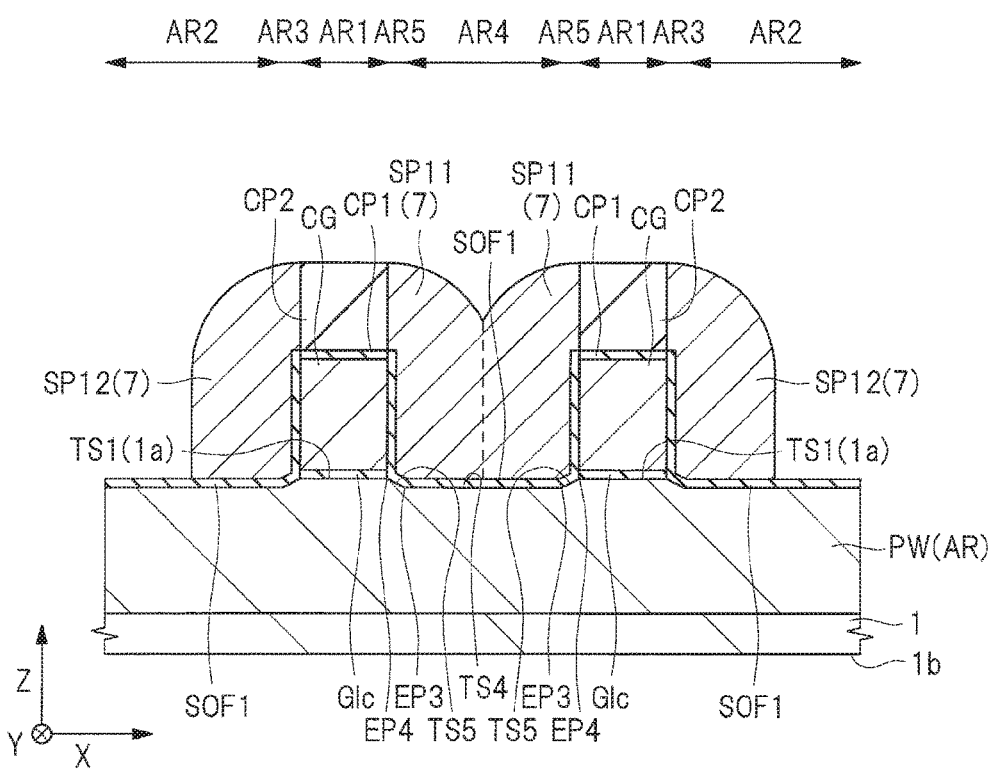
FIG. 9 is a cross-sectional view of a principal part during a manufacturing process of a semiconductor device according to an embodiment.

Next, as illustrated in FIG. 9, the film 7 is etched back by using an anisotropic etching technique, so that a spacer SP11 serving as a sidewall portion is formed (step S7 illustrated in FIG. 5).

In step S7, the film 7 is etched back to such an extent as to be the thickness of the film 7, so that the film 7 is left to be, for example, sidewall spacers on both the side surfaces of the control gate electrode CG via the sacrificial oxide film SOF1.

Thus, the film 7 is left to be a sidewall spacer on one side surface of both the side surfaces of the control gate electrode CG, the one side surface being on the opposite side to a portion where the memory gate electrode MG adjacent to this control gate electrode CG (see FIG. 19 described below) is arranged, so that the spacer SP11 formed of the left film 7 is formed.

In a pair of two adjacent control gate electrodes CG, on the opposite side to the other control gate electrode CG across one control gate electrode CG, the memory gate electrode MG adjacent to the one control gate electrode CG is arranged. Consider a case in which the thickness of the film 7 is such a thickness as to fill a space between the two adjacent control gate electrodes CG with the film 7 even when the film 7 is etched back by only the thickness of the film 7 as described above. In such a case, the two spacers SP11 each formed on one side surface of both side surfaces of each of the two adjacent control gate electrodes CG are arranged without any space, the one side surface being on the opposite side to the side on which the memory gate electrode MG adjacent to the control gate electrode CG is arranged. That is, the two spacers SP11 are integrally formed with each other.

The film 7 is left in a sidewall spacer form on a side surface of both the side surfaces of the control gate electrode CG, the side surface being on which the memory gate electrode MG adjacent to this control gate electrode CG is arranged, so that a spacer SP12 formed of the left film 7 is formed.

Figure 10:
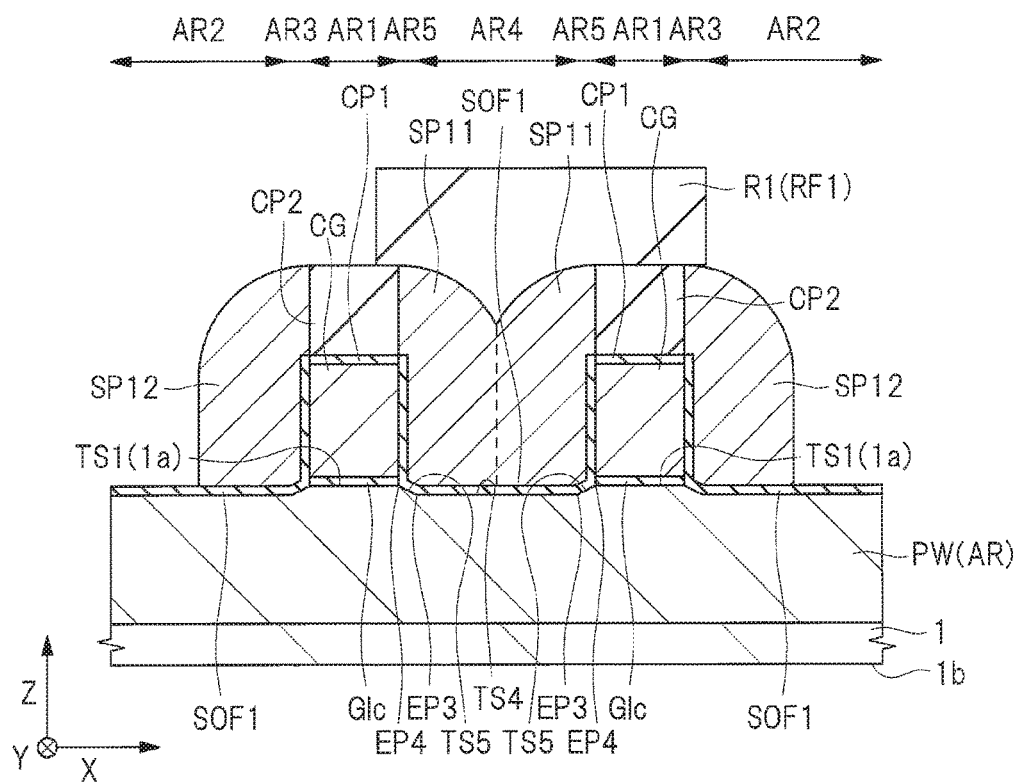
FIG. 10 is a cross-sectional view of a principal part during a manufacturing process of a semiconductor device according to an embodiment.
Figure 11:
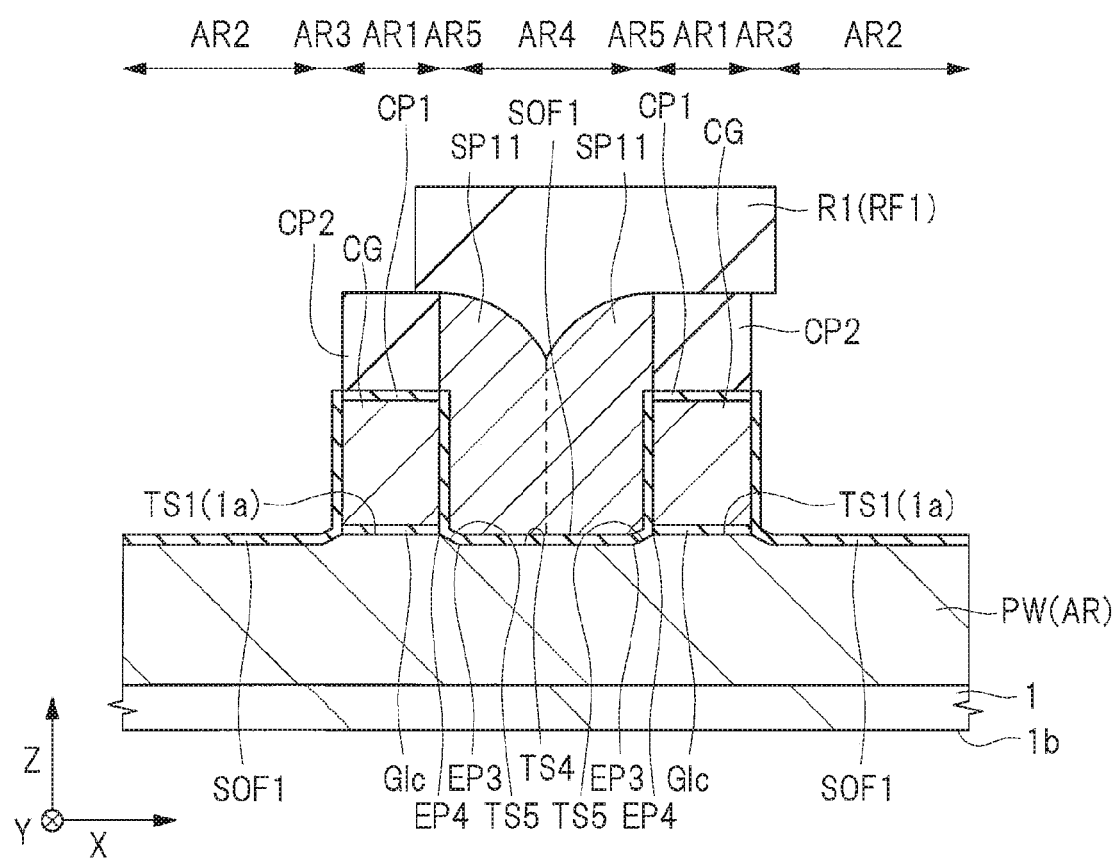
FIG. 11 is a cross-sectional view of a principal part during a manufacturing process of a semiconductor device according to an embodiment.
Figure 12:
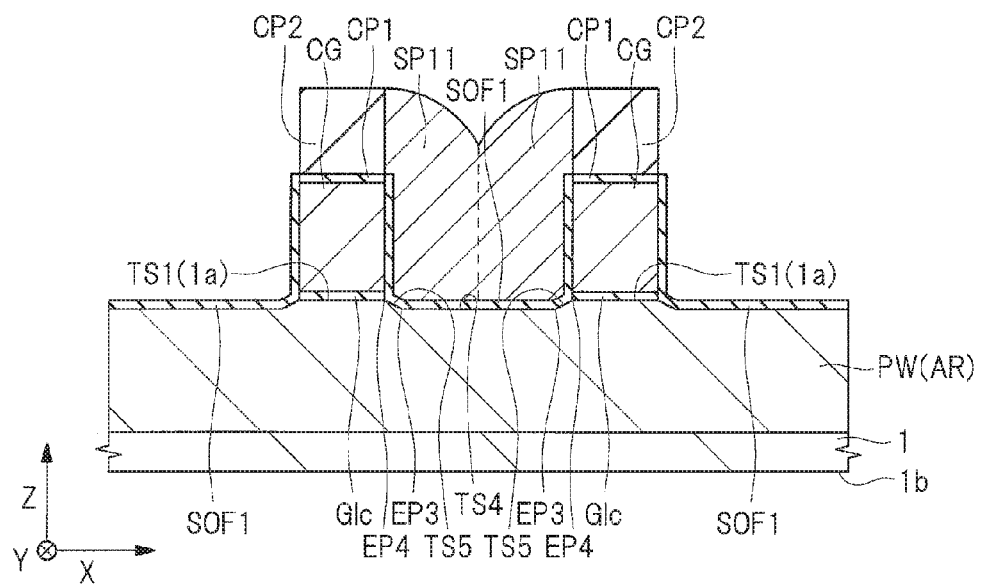
FIG. 12 is a cross-sectional view of a principal part during a manufacturing process of a semiconductor device according to an embodiment.

Next, as illustrated in FIGS. 10 to 12, the spacer SP12 is removed (step S8 illustrated in FIG. 5).

In step S8, first, as illustrated in FIG. 10, such a resist pattern R1 as covering the spacer SP11 and as exposing the spacer SP12 is formed on the semiconductor substrate by using photolithography.

More specifically, first, a resist film RF1 serving as a mask film is formed on the sacrificial oxide film SOF1, i.e., on the semiconductor substrate 1 to cover the spacers SP11 and SP12. Then, the resist film RF1 is patterned, the resist pattern R1 serving as a mask pattern formed of the resist film RF1 covering the spacer SP11 is formed, and the spacer SP12 is exposed from the resist film RF1.

In step S8, next, as illustrated in FIG. 11, the spacer SP12 is removed by dry etching using the formed resist pattern R1 as an etching mask. On the other hand, the spacer SP11 is not etched and is left because of being covered with the resist pattern R1.

As illustrated in FIG. 10, consider a case in which a part of the resist pattern R1 is arranged so as to protrude outward from a side surface, which is closer to the spacer SP12, of both the side surfaces of the control gate electrode CG. That is, consider a case in which the resist pattern R1 overlaps a part of the spacer SP12 which is closer to the control gate electrode CG in a plan view. Also in such a case, the spacer SP12 can also be completely removed by removing the spacer 12 by using an isotropic etching technique in a process for performing the etching illustrated in FIG. 11.

Then, in step S8, then, the resist pattern R1 is removed as illustrated in FIG. 12.

Figure 13:
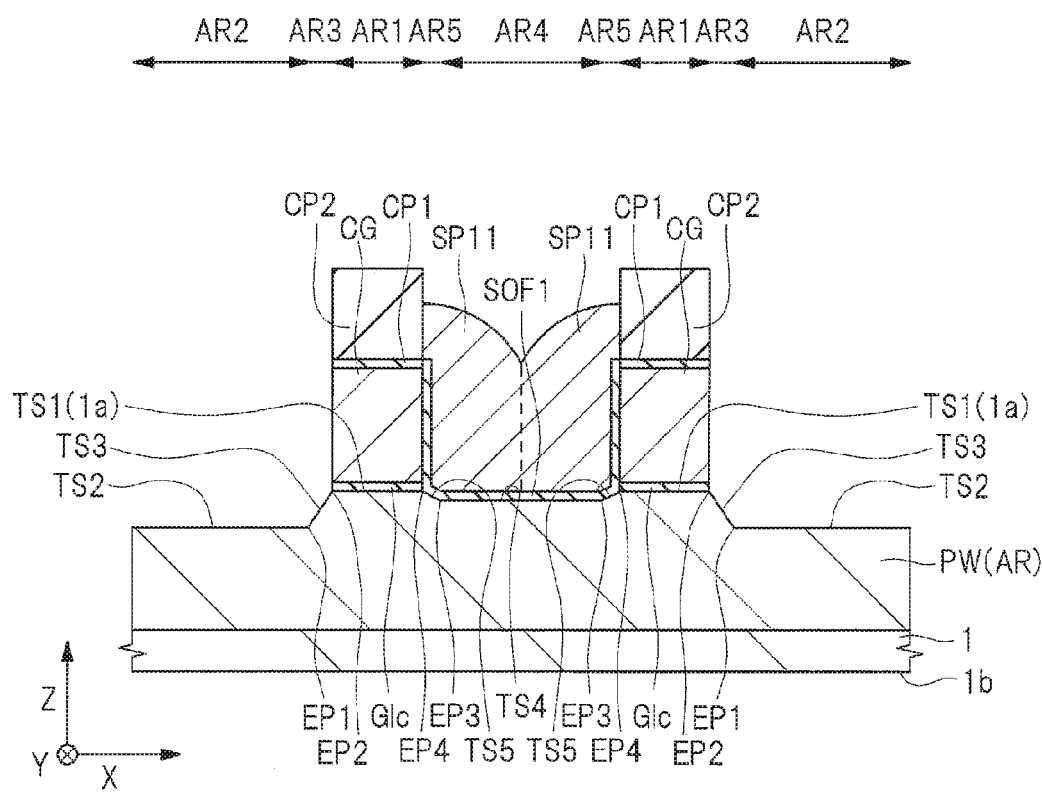
FIG. 13 is a cross-sectional view of a principal part during a manufacturing process of a semiconductor device according to an embodiment.

Next, as illustrated in FIG. 13, the sacrificial oxide film SOF1 is removed (step S9 illustrated in FIG. 5). In step S9, the control gate electrode CG and the sacrificial oxide film SOF1 in a portion exposed from the spacer SP11 are etched and removed by, for example, dry etching or others. Thus, in the regions AR2 and AR3, the main surface 1a of the semiconductor substrate 1 is exposed.

Next, as illustrated in FIG. 13, the surface of the semiconductor substrate 1 is etched (step S10 illustrated in FIG. 5). In step S10, a surface of each of the regions AR2 and AR3 in the semiconductor substrate 1 is etched by dry etching using the control gate electrode CG, the cap insulating film CP2 on the control gate electrode CG, and the spacer SP11 as an etching mask.

Thus, the upper surface TS2 of the region AR2 is made lower than the upper surface TS1 of the region AR1, and a connection surface TS3 connecting the upper surface TS1 of the region AR1 and the upper surface TS2 of the region AR2 is formed in the region AR3 arranged between the region AR1 and the region AR2. Note that the upper surface TS2 of the region AR2 is made lower than the upper surface TS4 of the region AR4.

An end EP1 of the connection surface TS3 is connected to the upper surface TS2 of the region AR2, and an end EP2 of the connection surface TS3 which is on the opposite side to the end EP1 is connected to the upper surface TS1 of the region AR1. The end EP1 of the connection surface TS3 is arranged closer to the opposite side to the region AR4 than the end EP2 of the connection surface TS3 in the X-axis direction, and is arranged lower than the end EP2 of the connection surface TS3 in the Z-axis direction. In other words, the connection surface TS3 is inclined with respect to both the upper surface TS2 and the YZ plane so that the end EP1 is positioned closer to the opposite side to the region AR4 than the end EP2 in the X-axis direction and is positioned lower than the end EP2 in the Z-axis direction.

Therefore, as a condition of the etching in step S10, it is desirable to perform the etching under a condition in which an etching selectivity between the cap insulating film CP2 formed of the insulating film 6 such as a silicon nitride film and the semiconductor substrate 1 formed of, for example, silicon, i.e., a ratio of an etching speed of the semiconductor substrate 1 to an etching speed of the cap insulating film CP2 is as high as possible.

In etching for making the surface of each of the region AR2 and the region AR3 low, a process for depositing a deposited material on the surface and a process for etching the surface are practically repeated to increase the etched amount to be larger than a deposited amount of the deposited material, so that the etching proceeds. At this time, in the region AR3 in the vicinity of an end of the control gate electrode CG, the deposited amount of the deposited material is larger than the etched amount because of the existence of the side surface of the control gate electrode CG. As a result, in the region AR3, the connection surface TS3 inclined from an end of the region AR3 which is closer to the control gate electrode CG to an end of the same which is closer to the region AR2 is formed. An angle of inclination of the connection surface TS3 can be adjusted to some extent by changing a balance between the deposited amount of the deposited material and the etched amount in the etching condition.

In step S10, note that an upper part of the spacer SP11 is slightly etched. Therefore, the upper surface of the spacer SP11 after step S10 becomes lower than the upper surface of the spacer SP11 before step S10.

As described above with reference to FIG. 2, the angle ANS1 of the acute angle made by the connection surface TS3 and the upper surface TS2 is larger than the angle ANS2 of the acute angle made by the connection surface TS5 and the upper surface TS4.

Figure 14:
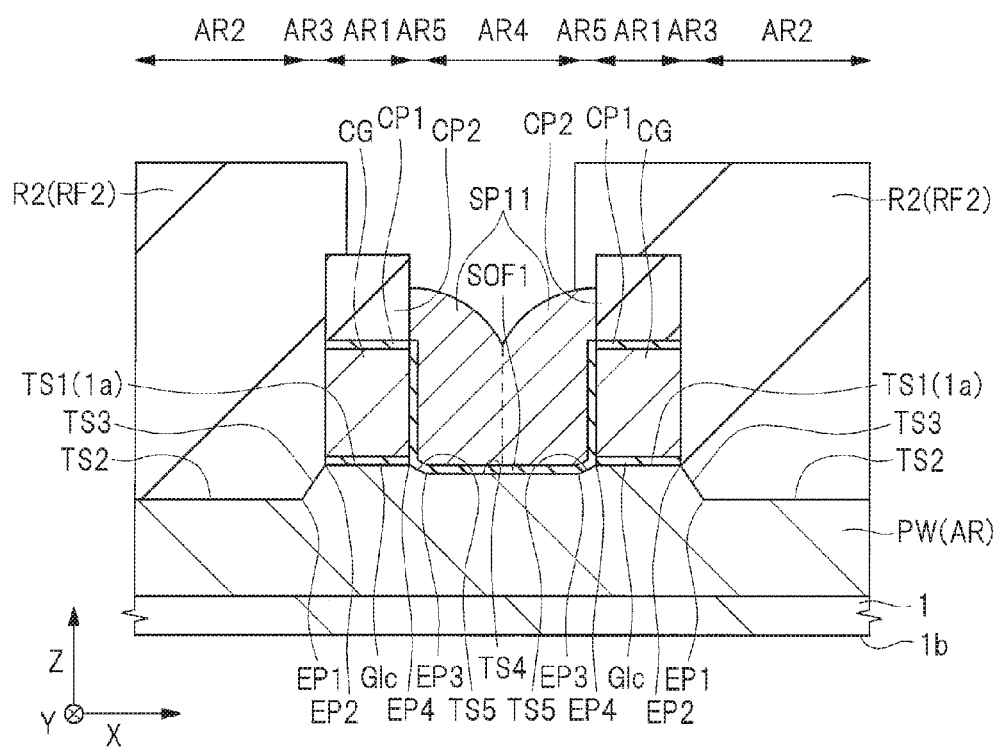
FIG. 14 is a cross-sectional view of a principal part during a manufacturing process of a semiconductor device according to an embodiment.
Figure 15:
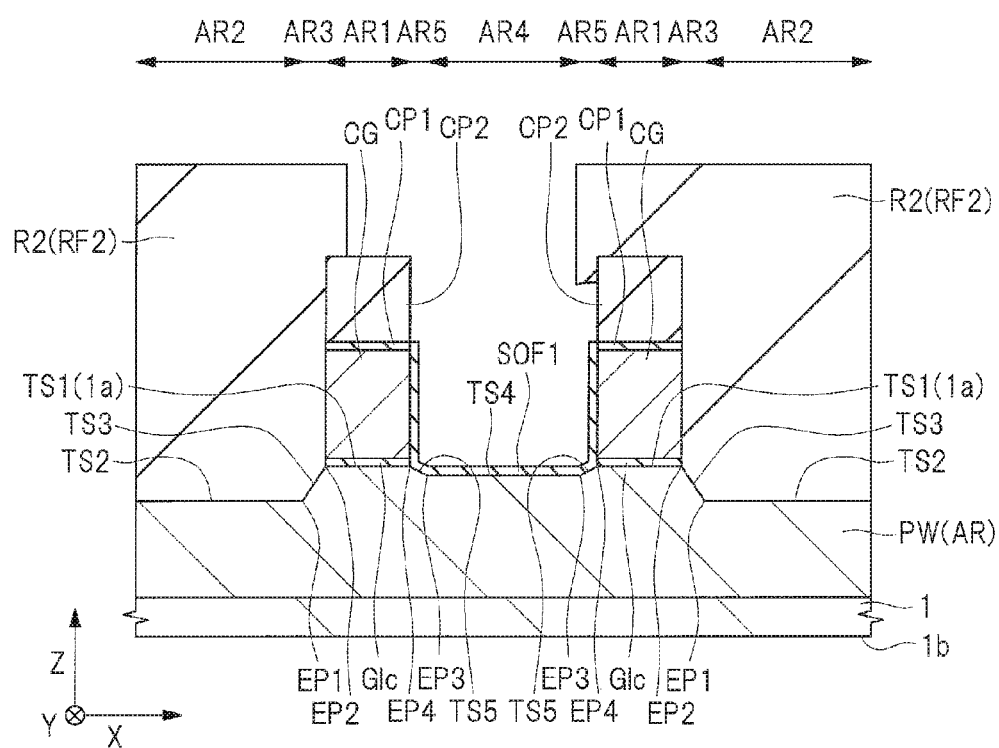
FIG. 15 is a cross-sectional view of a principal part during a manufacturing process of a semiconductor device according to an embodiment.
Figure 16:
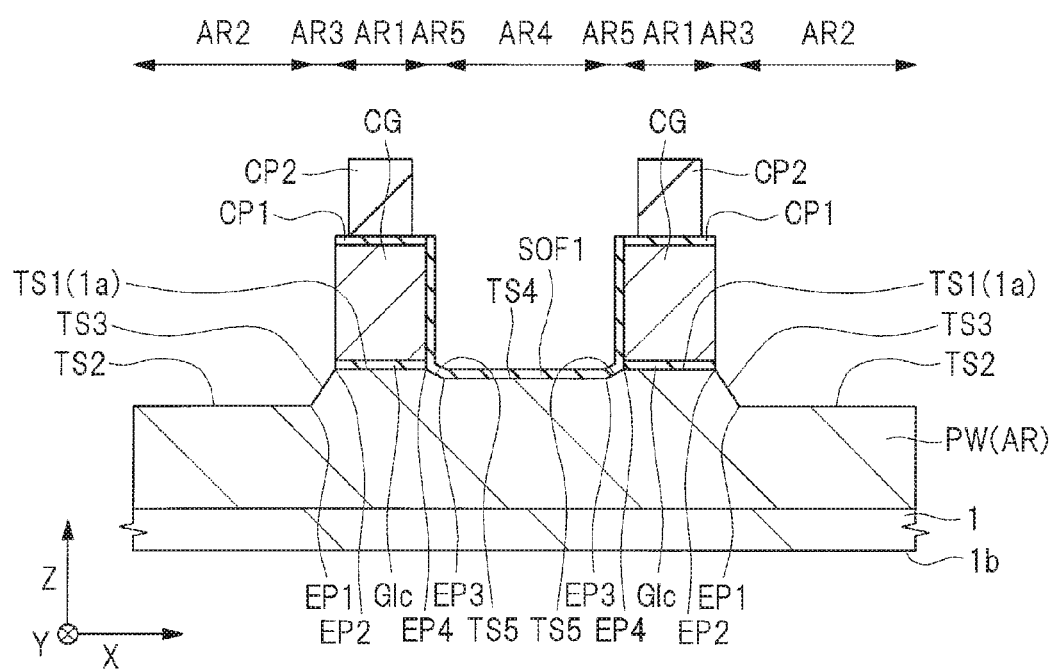
FIG. 16 is a cross-sectional view of a principal part during a manufacturing process of a semiconductor device according to an embodiment.

Next, as illustrated in FIGS. 14 to 16, the spacer SP11 is removed (step S11 illustrated in FIG. 5).

In step S11, first, as illustrated in FIG. 14, such a resist pattern R2 as covering the regions AR2 and AR3 and as exposing the spacer SP11 is formed on the semiconductor substrate 1 by using photolithography.

More specifically, a resist film RF2 serving as a mask film is first formed to cover the spacer SP11 on the semiconductor substrate 1. Then, the resist film RF2 is then patterned, to form the resist pattern R2 formed of the resist film RF2 covering the regions AR2 and AR3 and expose the spacer SP11 from the resist film RF2.

In step S11, next, as illustrated in FIG. 15, the spacer SP11 is removed by dry etching using the formed resist pattern R2 as an etching mask. On the other hand, the regions AR2 and AR3 are not etched and are left because of being covered with the resist pattern R2.

As illustrated in FIG. 14, consider a case in which a part of the resist pattern R2 is arranged so as to protrude outward from a side surface, which is closer to the spacer SP11, of both the side surfaces of the control gate electrode CG. That is, consider a case in which the resist pattern R2 overlaps a part of the spacer SP11 which is closer to the control gate electrode CG in a plan view. Also in such a case, the spacer SP11 can also be completely removed by removing the spacer 11 by using an isotropic etching technique in a process for performing the etching illustrated in FIG. 15.

Then, in step S11, then, the resist pattern R2 is removed as illustrated in FIG. 16.

Next, as illustrated in FIG. 17, an $n^-$-type semiconductor region VMG is formed (step S12 illustrated in FIG. 6).

In step S12, first, as illustrated in FIG. 17, the main surface 1a of the semiconductor substrate 1 and a side surface of the side surfaces of the control gate electrode CG, the side surface being on which the sacrificial oxide film SOF1 is not formed, are oxidized, so that a sacrificial oxide film SOF2 is formed. The sacrificial oxide film SOF2 can be formed by using, for example, a thermal oxidation method, an ISSG oxidation method, or using both of the thermal oxidation method and the ISSG oxidation method.

In step S12, next, as illustrated in FIG. 17, n-type impurities such as phosphorous (P) or arsenic (As) are introduced into the p-type well PW by an ion implantation method using the cap insulating film CP2 and the control gate electrode CG whose side surfaces have the sacrificial oxide films SOF1 and SOF2 formed as a mask. Thus, the $n^-$-type semiconductor region VMG is formed in an upper layer portion of the p-type well PW in a portion positioned closer to the side on which the memory gate electrode MG (see FIG. 19, described below) is arranged than the control gate electrode CG, i.e., an upper layer portion of each of the regions AR2 and AR3.

In a plan view, the sacrificial oxide film SOF2 is formed on an upper surface of the p-type well PW in a portion positioned closer to the side on which the memory gate electrode MG (see FIG. 19, described below) adjacent to the control gate electrode CG is arranged than the control gate electrode CG. Thus, when n-type impurities are introduced into the p-type well PW by using an ion implantation method, the upper surface of the p-type well PW can be prevented from being damaged.

As described above, the upper surface TS2 of the region AR2 is lower than the upper surface TS1 of the region AR1, and the connection surface TS3 connecting the upper surface TS1 and the upper surface TS2 is formed between the upper surface TS1 and the upper surface TS2. The end EP1 of the connection surface TS3 which is closer to the upper surface TS2 is arranged closer to the opposite side to the control gate electrode CG than the end EP2 of the connection surface TS3 which is closer to the upper surface TS1, and is arranged lower than the end EP2 in the Z-axis direction. Therefore, the impurity ions implanted by ion implantation is introduced into the p-type well PW in a portion positioned below the control gate electrode CG so as to cross the connection surface TS3. Therefore, the n⁻-type semiconductor region VMG can be formed in a desired region with high shape accuracy.

Note that the n⁻-type semiconductor region VMG may be formed closer to the opposite side to the side on which the memory gate electrode MG adjacent to the control gate electrode CG is arranged than this control gate electrode CG. However, in FIG. 17, illustration is omitted in an n⁻-type semiconductor region formed closer to the opposite side to the side on which the memory gate electrode MG adjacent to the control gate electrode CG is arranged than the control gate electrode CG. That is, while the n⁻-type semiconductor region VMG is also formed in an upper layer portion of each of the regions AR4 and AR5, illustration thereof is omitted in FIG. 17.

Next, as illustrated in FIG. 17, sliming for the cap insulating film CP2 is performed (step S13 illustrated in FIG. 6).

For example, when the sacrificial oxide films SOF1 and SOF2 and the cap insulating film CP1 are each a silicon oxide film, and when the cap insulating film CP2 is a silicon nitride film, etching is performed while using, for example, a phosphoric acid, i.e., a hot phosphoric acid having a temperature of about 140 to 170° C. as an etchant. This manner can sufficiently increase the ratio of the etching speed of the cap insulating film CP2 to the etching speed of the sacrificial oxide films SOF1 and SOF2 and the cap insulating film CP1, i.e., increase the selectivity therebetween. Therefore, the cap insulating film CP2 can be selectively etched.

Thus, the length in the X-axis direction, i.e., a gate length direction of the cap insulating film CP2 can be made smaller than the length in the X-axis direction, i.e., the gate length direction of the control gate electrode CG. That is, the slimming for the cap insulating film CP2 can be performed.

Next, as illustrated in FIG. 18, an insulating film 8 is formed on the entire main surface 1a of the semiconductor substrate 1 (step S14 illustrated in FIG. 6).

In step S14, an insulating film 8 is formed on the semiconductor substrate 1 in an exposed portion, i.e., on the upper surface TS2 and the connection surface TS3 and a surface of the control gate electrode CG and a surface of the cap insulating film CP2. That is, in step S14, the insulating film 8 is formed on the semiconductor substrate 1 so as to cover the control gate electrode CG and the cap insulating film CP2.

The insulating film 8 is an insulating film having a charge accumulating portion therein, and is formed of a stacked film of a silicon oxide film 8a, a silicon nitride film 8b, and a silicon oxide film 8c formed in this order from below as the insulating film.

The silicon oxide film 8a of the insulating film 8 can be formed by, for example, a thermal oxidation method, an ISSG oxidation method, or others. The silicon nitride film 8b of the insulating film 8 can be formed by, for example, a CVD method. Further, the silicon oxide film 8c of the insulating film 8 can be formed by, for example, a CVD method or an ISSG oxidation method.

First, the silicon oxide film 8a is formed on the main surface 1a of the semiconductor substrate 1, the side surfaces of the control gate electrode CG, and an upper surface and side surfaces of the cap insulating film CP2 in the exposed portion by, for example, using a thermal oxidation method or an ISSG oxidation method.

The thickness of the silicon oxide film 8a can be set to, for example, about 4 nm. As another aspect, the silicon oxide film 8a can also be formed by using an ALD method.

Next, the silicon nitride film 8b is formed on the silicon oxide film 8a by using, for example, a CVD method, and the silicon oxide film 8c is further formed on the silicon nitride film 8b by using, for example, a CVD method, an ISSG oxidation method, or both them. Thus, the insulating film 8 formed of a stacked film of the silicon oxide film 8a, the silicon nitride film 8b, and the silicon oxide film 8c can be formed.

The insulating film 8 functions as a gate insulating film of the memory gate electrode MG (see FIG. 19 described below), and has a charge storage function. The insulating film 8 has a structure in which the silicon nitride film 8b serving as a charge accumulating portion is sandwiched between the silicon oxide film 8a and the silicon oxide film 8c serving as a charge block layer. A potential barrier height of the charge block layer formed of the silicon oxide films 8a and 8c becomes larger than a potential barrier height of the charge accumulating portion formed of the silicon nitride film 8b.

In the present embodiment, note that the silicon nitride film 8b is used as an insulating film having a trap level, and the usage of the silicon nitride film 8b is preferable in terms of reliability. However, the insulating film having a trap level is not limited to the silicon nitride film. A high-dialectic-constant film having a higher dielectric constant than that of the silicon nitride film, e.g., an aluminum oxide (alumina) film, a hafnium oxide film, or a tantalum oxide film can be used.

Next, as illustrated in FIG. 18, the conductive film 9 is formed on the entire main surface 1a of the semiconductor substrate 1, i.e., on the insulating film 8 (Step 15 illustrated in FIG. 6).

Preferably, the conductive film 9 is formed of a silicon film such as a polycrystalline silicon film, i.e., a polysilicon film. Such a conductive film 9 can be formed by using a CVD method or others. After the conductive film 9 is formed as an amorphous silicon film at the time of film formation, the amorphous silicon film can also be formed as a polycrystalline silicon film in subsequent heat treatment.

As the conductive film 9, it is preferable to use a material having a low resistivity made by introducing, for example, n-type impurities such as phosphorous (P) or arsenic (As) or p-type impurities such as boron (B). The impurities can be introduced at the time of or after the formation of the conductive film 9. While the impurities can be introduced into the conductive film 9 by the ion implantation after the formation of the conductive film 9, the impurities can be introduced into the conductive film 9 by the ion implantation at the time of the formation of the conductive film 9. If the impurities are introduced at the time of the formation of the conductive film 9, the conductive film 9 to which the impurities have been introduced can be formed by containing doping gas in gas for forming the conductive film 9.

Figure 19:
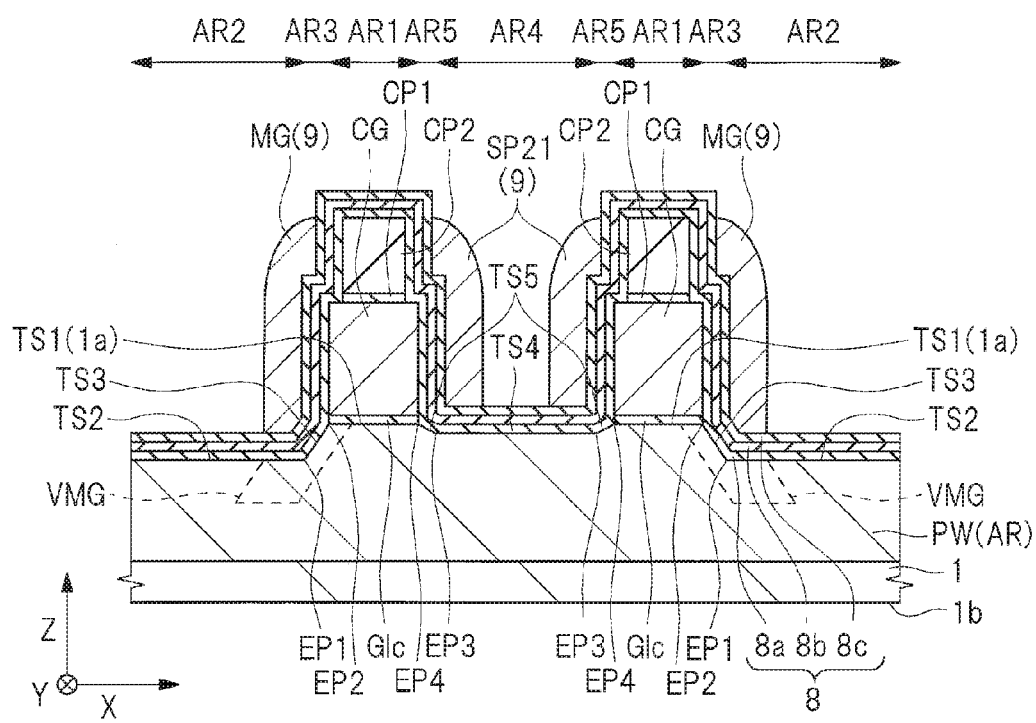
FIG. 19 is a cross-sectional view of a principal part during a manufacturing process of a semiconductor device according to an embodiment.

Next, as illustrated in FIG. 19, the conductive film 9 is etched back by using an anisotropic etching technique, so that the memory gate electrode MG is formed (step S16 illustrated in FIG. 6).

In step S16, the conductive film 9 is etched back by only the thickness of the conductive film 9, so that the conductive film 9 is left in a sidewall spacer form on both the side surfaces of the control gate electrode CG via the insulating film 8, and the conductive film 9 in other region is removed.

Thus, as illustrated in FIG. 19, the film 9 is left in a sidewall spacer form on a side surface of both the side surfaces of the control gate electrode CG, the side surface being on which the memory gate electrode MG adjacent to this control gate electrode CG is arranged, so that the memory gate electrode MG formed of the left film 9 is formed. More specifically, the memory gate electrode MG is formed on the upper surface TS2 of the region AR2. And, the film 9 is left in a sidewall spacer form on a side surface of both the side surfaces of the control gate electrode CG, the side surface being on the opposite to the side on which the memory gate electrode MG adjacent to this control gate electrode CG is arranged, so that the spacer SP21 formed of the left film 9 is formed.

The memory gate electrode MG is formed to be adjacent to the control gate electrode CG via the insulating film 8. The memory gate electrode MG and the spacer SP21 are formed on the side surfaces of the control gate electrode CG which are on the opposite sides to each other.

The cap insulating film CP2 is formed on the control gate electrode CG. Therefore, the memory gate electrode MG is formed of the film 9 left in the sidewall spacer form on a side surface of both the side surfaces of the cap insulating film CP2, the side surface being on which the memory gate electrode MG adjacent to this control gate electrode CG is arranged. And, the spacer 21 is formed of the film 9 left in the sidewall spacer form on a side surface of both the side surfaces of the cap insulating film CP2, the side surface being on the opposite to the side on which the memory gate electrode MG adjacent to this control gate electrode CG is arranged.

The insulating film 8 is interposed between the memory gate electrode MG formed in step S16 and the p-type well PW in the semiconductor substrate 1 and between the memory gate electrode MG and the control gate electrode CG, and the memory gate electrode MG is formed of the conductive film 9 contacting the insulating film 8.

At a stage at which the etch-back process in step S16 has been performed, the insulating film 8 in a portion which is covered with neither the memory gate electrode MG nor the spacer SP21 is exposed. The insulating film 8 below the memory gate electrode MG becomes a gate insulating film GIm (see FIG. 22 described below) in the memory transistor MT.

Figure 20:
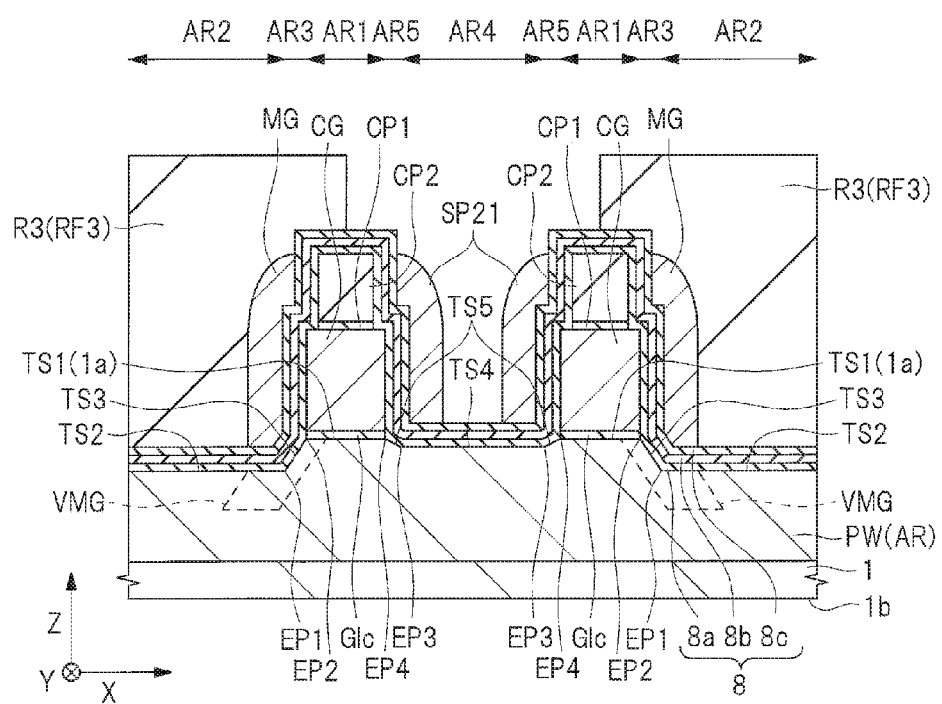
FIG. 20 is a cross-sectional view of a principal part during a manufacturing process of a semiconductor device according to an embodiment.
Figure 21:
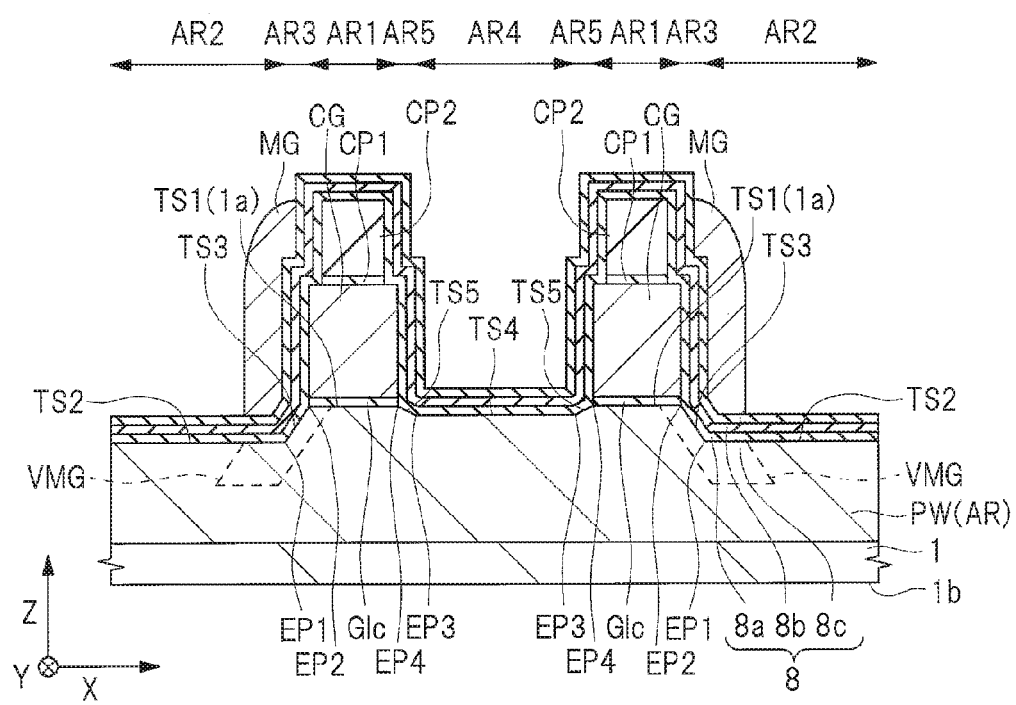
FIG. 21 is a cross-sectional view of a principal part during a manufacturing process of a semiconductor device according to an embodiment.

Next, as illustrated in FIGS. 20 and 21, the spacer SP21 is removed (step S17 illustrated in FIG. 6).

In step S17, first, as illustrated in FIG. 20, such a resist pattern R3 as covering the memory gate electrode MG and as exposing the spacer SP21 is formed on the semiconductor substrate 1 by using photolithography.

More specifically, first, on the insulating film 8, a resist film RF3 serving as a mask film is formed to cover the memory gate electrode MG and the spacer SP21.

Next, the resist film RF3 is patterned, so that the resist pattern R3 formed of the resist film RF3 covering the memory gate electrode MG is formed. The spacer SP21 is exposed from the resist film RF3.

In step S17, next, as illustrated in FIG. 21, the spacer SP21 is removed by dry etching while using the formed resist pattern R3 as an etching mask. On the other hand, the memory gate electrode MG is not etched and is left because of being covered with the resist pattern R3.

In step S17, then, as illustrated in FIG. 21, the resist pattern R2 is then removed.

Figure 22:
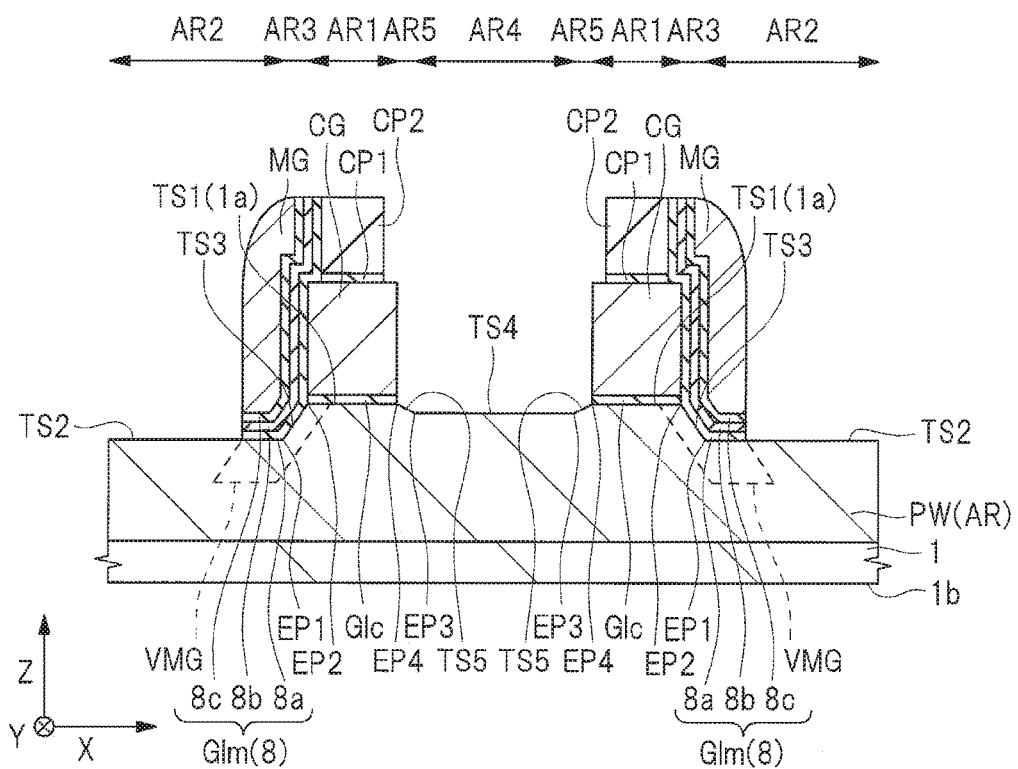
FIG. 22 is a cross-sectional view of a principal part during a manufacturing process of a semiconductor device according to an embodiment.

Next, as illustrated in FIG. 22, the insulating film 8 in a portion which is not covered with the memory gate electrode MG is removed by etching (step S18 illustrated in FIG. 6).

At this time, the insulating film 8 in portions respectively positioned between the memory gate electrode MG and the p-type well PW and between the memory gate electrode MG and the control gate electrode CG is not removed and is left, and the insulating film 8 in a portion positioned in other region is removed. The gate insulating film GIm formed of the insulating film 8 between the memory gate electrode MG and the p-type well PW, i.e., the semiconductor substrate 1 and between the memory gate electrode MG and the control gate electrode CG is formed.

In step S18, note that etching can also be performed so that the silicon oxide film 8$c$ and the silicon nitride film 8$b$ in the insulating film 8 are removed while the silicon oxide film 8$a$ is not removed and is left.

Figure 23:
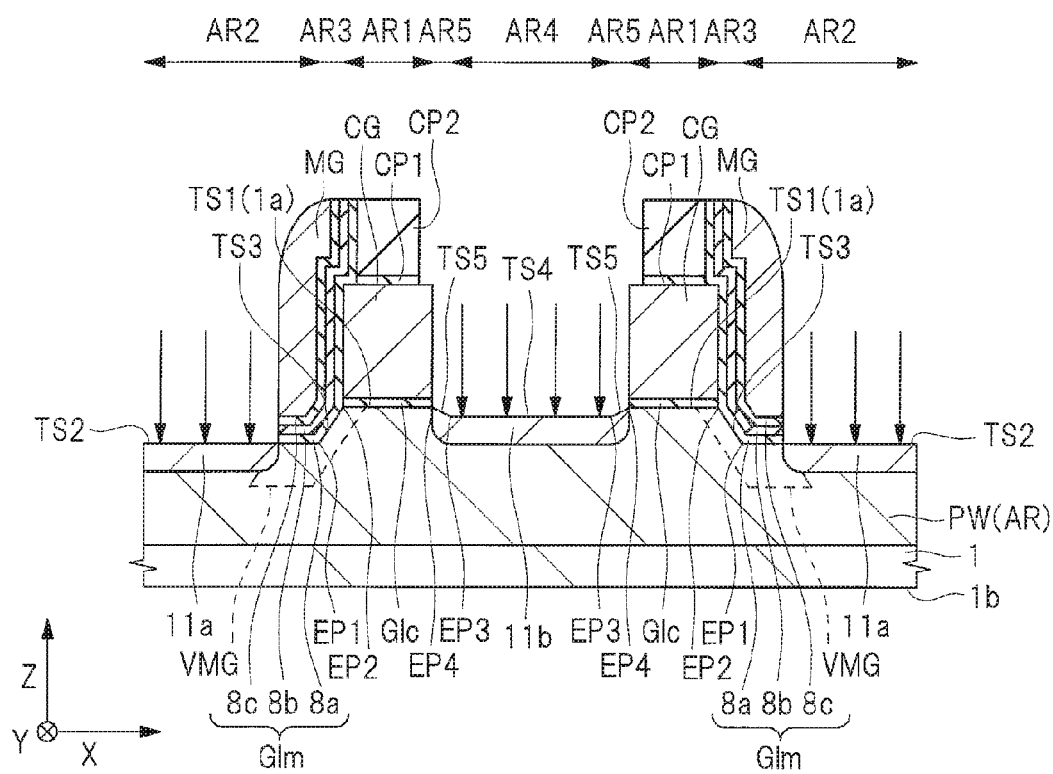
FIG. 23 is a cross-sectional view of a principal part during a manufacturing process of a semiconductor device according to an embodiment.

Next, as illustrated in FIG. 23, n$^-$-type semiconductor regions 11$a$ and 11$b$ are formed by using anion implantation method or others (step S19 illustrated in FIG. 6).

In step S19, n-type impurities such as arsenic (As) or phosphorus (P) are introduced into the p-type well PW in the semiconductor substrate 1 while using the control gate electrode CG and the memory gate electrode MG as a mask. Thus, the n$^-$-type semiconductor regions 11$a$ and 11$b$ are formed in an upper layer portion of the p-type well PW.

At this time, the n$^-$-type semiconductor region 11$a$ is formed to be self-aligned with the side surface of the memory gate electrode MG, and the n$^-$-type semiconductor region 11$b$ is formed to be self-aligned with the side surface of the control gate electrode CG.

After step S18 but before step S19, in a peripheral circuit region (illustration is omitted) different from a memory cell region where the memory cell MC is formed, note that the conductive film (see FIG. 7) may be patterned by using, for example, photolithography and etching to form a gate electrode (illustration is omitted) formed of the conductive film 4. At this time, before a resist is applied, for example, an insulating film SIF formed of a silicon oxide film and a silicon nitride film (illustration is omitted) may be formed on the main surface 1$a$ of the semiconductor substrate 1 in the memory cell region as a protective film in the memory cell region used when the conductive film 4 is patterned in the peripheral circuit region. After a gate electrode is formed in the peripheral circuit region, the silicon nitride film may be removed. In such a case, when the n$^-$-type semiconductor region 11$a$ and 11$b$ are formed in step S19, the insulating film SIF (see FIG. 24, described below) is formed to cover the control gate electrode CG, the cap insulating film CP2, and the memory gate electrode MG in the memory cell region.

Figure 24:
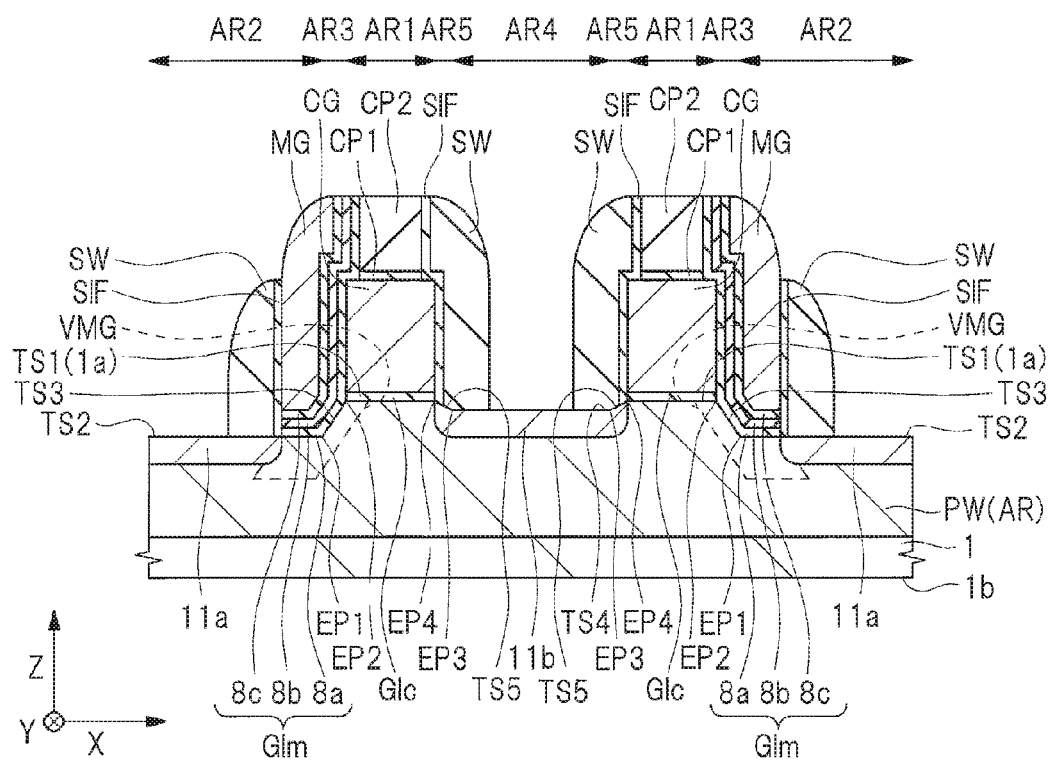
FIG. 24 is a cross-sectional view of a principal part during a manufacturing process of a semiconductor device according to an embodiment.

Next, as illustrated in FIG. 24, a sidewall spacer SW is formed on the side surface of the control gate electrode CG and the side surface of the memory gate electrode MG (step S20 illustrated in FIG. 6).

First, an insulating film for the sidewall spacer SW is formed on the entire main surface 1$a$ of the semiconductor substrate 1, and the formed insulating film is etched back by, for example, using anisotropic etching.

Thus, the insulating film in a portion on the opposite side to the memory gate electrode MG across the control gate electrode CG, the portion being adjacent to the control gate electrode CG, is left, so that the sidewall spacer SW is formed. And, the insulating film in a portion on the opposite side to the control gate electrode CG across the memory gate electrode MG, the portion being adjacent to the memory gate electrode MG, is left, so that the sidewall spacer SW is formed.

Each of these sidewall spacers SW is formed of an insulating film such as a silicon oxide film, a silicon nitride film, or their stacked film.

In an example illustrated in FIG. 24, note that the insulating film SIF made of, for example, silicon oxide is interposed between the control gate electrode CG and the sidewall spacer SW and between the memory gate electrode MG and the sidewall spacer SW.

Figure 25:
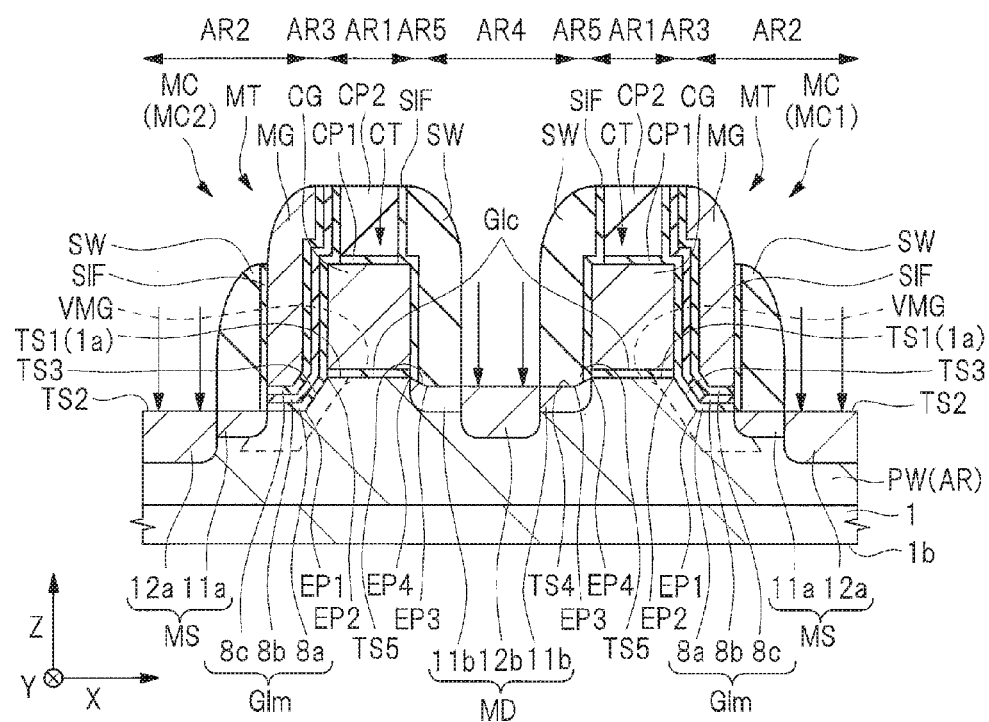
FIG. 25 is a cross-sectional view of a principal part during a manufacturing process of a semiconductor device according to an embodiment.

Next, as illustrated in FIG. 25, n$^+$-type semiconductor regions 12a and 12b are formed by using anion implantation method or others (step S21 illustrated in FIG. 6). In step S21, n-type impurities such as arsenic (As) or phosphorus (P) are introduced into the p-type well PW in the semiconductor substrate 1 while using the control gate electrode CG, the memory gate electrode MG and the sidewall spacer SW adjacent thereto as a mask. Thus, the n$^+$-type semiconductor regions 12a and 12b are formed in the upper layer portion of the p-type well PW.

At this time, the n$^+$-type semiconductor region 12a is formed to be self-aligned with the sidewall spacer SW on the side surface of the memory gate electrode MG, and the n$^+$-type semiconductor region 12b is formed to be self-aligned with the sidewall spacer SW on the side surface of the control gate electrode CG.

This manner forms an n-type semiconductor region MS which has the LDD structure formed of the n$^-$-type semiconductor region 11a and the n$^+$-type semiconductor region 12a having a higher impurity concentration than that of the n$^-$-type semiconductor region 11a and which functions as a source region of the memory transistor MT. Also, this manner forms an n-type semiconductor region MD which has the LDD structure formed of the n$^-$-type semiconductor region 11b and the n$^+$-type semiconductor region 12b having a higher impurity concentration than that of the n$^-$-type semiconductor region 11b and which functions as a drain region of the control transistor CT.

Then, activation annealing serving as heat treatment for activating impurities introduced into the n$^-$-type semiconductor regions 11a and 11b and the n$^+$-type semiconductor region 12a and 12b and others is performed.

Thus, as illustrated in FIG. 25, the control transistor CT and the memory transistor MT are formed, and the memory cell MC serving as a nonvolatile memory is formed of the control transistor CT and the memory transistor MT. That is, the memory cell MC serving as the nonvolatile memory is formed of the control gate electrode CG, the gate insulating film GIc, the memory gate electrode MG, and the gate insulating film GIm. Note that the memory cells MC1 and MC2 serving as two adjacent memory cells MC share the n$^+$-type semiconductor region 12b.

Figure 26:
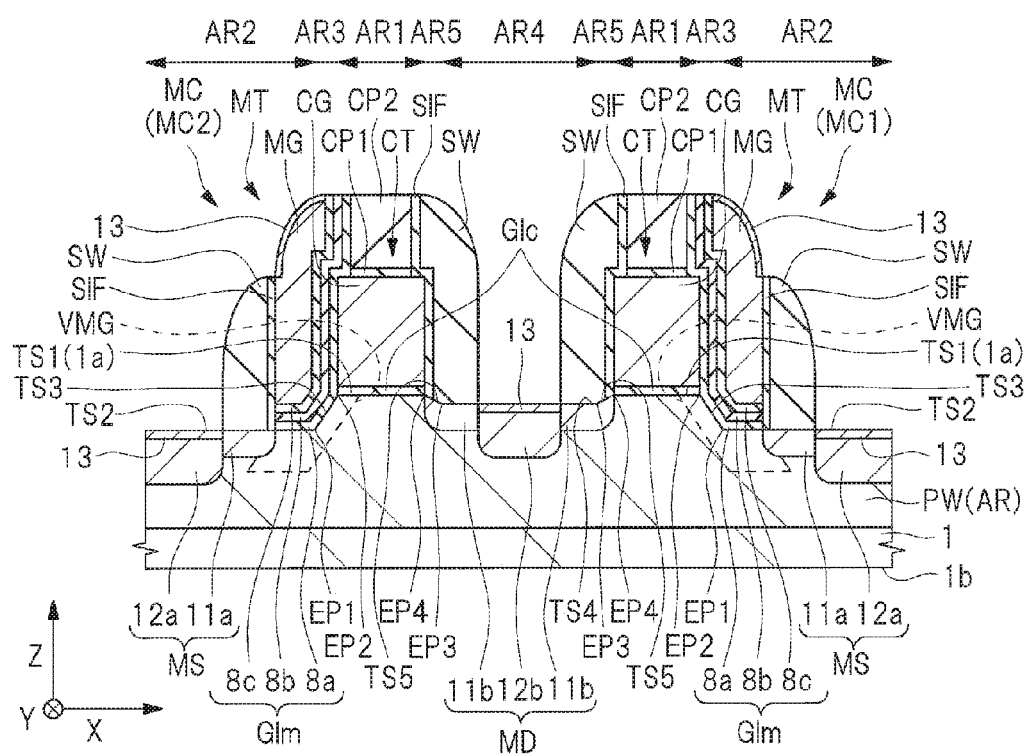
FIG. 26 is a cross-sectional view of a principal part during a manufacturing process of a semiconductor device according to an embodiment.

Next, as illustrated in FIGS. 26 and 27, a metal silicide layer 13, an insulating film 14, an interlayer insulating film 15, and a plug PG are formed (step S22 illustrated in FIG. 6).

In step S22, first, as illustrated in FIG. 26, a metal film is formed on the entire main surface 1a of the semiconductor substrate 1 to cover the cap insulating film CP2, the memory gate electrode MG, and the sidewall spacer SW. The metal film is formed of a cobalt (Co) film, a nickel (Ni) film, a nickel-platinum alloy film, or others, and can be formed by using a sputtering method or others. The semiconductor substrate 1 is subjected to heat treatment, so that an upper layer portion of each of the n$^+$-type semiconductor regions 12a and 12b and the memory gate electrode MG is reacted with the metal film. Thus, the metal silicide layer 13 is formed on each of the n$^+$-type semiconductor regions 12a and 12b and the memory gate electrode MG.

The metal silicide layer 13 can be, for example, a cobalt silicide layer, a nickel silicide layer, or a platinum-added nickel silicide layer. Then, an unreacted metal film is removed. Such a so-called salicide process is performed, so that the metal silicide layer 13 can be formed on each of the n$^+$-type semiconductor regions 12a and 12b and the memory gate electrode MG as illustrated in FIG. 3.

In step S22, next, as illustrated in FIG. 27, the insulating film 14 is then formed to cover the cap insulating film CP2, the gate insulating film GIm, the memory gate electrode MG, and the sidewall spacer SW. The insulating film 14 is formed of, for example, a silicon nitride film. The insulating film 14 can be formed by using, for example, a CVD method.

In step S22, next, as illustrated in FIG. 27, the interlayer insulating film 15 is formed on the insulating film 14. The interlayer insulating film 15 is formed of a single film of a silicon oxide film or a stacked film of a silicon nitride film and a silicon oxide film. After the interlayer insulating film 15 is formed by using, for example, a CVD method, an upper surface of the interlayer insulating film 15 is flattened.

In step S22, next, as illustrated in FIG. 27, the plug PG, which penetrates the interlayer insulating film 15, is formed. First, the interlayer insulating film 15 is dry-etched while using a resist pattern (not illustrated) formed on the interlayer insulating film 15 as an etching mask by using photolithography, so that a contact hole CNT is formed in the interlayer insulating film 15. Next, inside the contact hole CN, a conductive plug PG made of tungsten (W) or others is then formed as a conductor portion.

In order to form the plug PG, a barrier conductor film formed of, for example, a titanium (Ti) film, a titanium nitride (TiN) film, or their stacked film is formed on, for example, the interlayer insulating film 15 including the inside of the contact hole CNT. Then, a main conductor film formed of a tungsten (W) film or others is formed on the barrier conductor film so as to fill the contact hole CNT, and the unnecessary main conductor film and barrier conductor film on the interlayer insulating film 15 are removed by a CMP (Chemical Mechanical Polishing) method, an etch-back method, or others. Thus, the plug PG can be formed. For simplicity of the drawings, note that FIG. 27 illustrates the barrier conductor film and the main conductor film forming the plug PG to be integrated together.

As illustrated in FIG. 27, the contact hole CNT and the plug PG embedded therein are formed on the n$^+$-type semiconductor region 12b. For example, the metal silicide layer 13 on the n$^+$-type semiconductor region 12b is exposed from the bottom of the contact hole CNT. The plug PG embedded in the contact hole CNT is in contact with the metal silicide layer 13 formed on the n$^+$-type semiconductor region 12b, so that the plug PG is electrically connected to the n$^+$-type semiconductor region 12b. Note that the plug PG may be electrically connected to the n$^+$-type semiconductor region 12a although illustration is omitted in FIG. 27.

In the foregoing manner, the semiconductor device according to the present embodiment is manufactured. Note that a wiring containing, for example, copper (Cu) as a main conductive film can be formed by using, for example, a damascene technique on the interlayer insulating film 15 in which the plug PG is embedded. However, description for this is omitted here.

<Distribution of Electrons and Holes Injected into Charge Accumulating Portion>

Next, a distribution of electrons and holes injected into the silicon nitride film 8b serving as a charge accumulating portion will be described in comparison with a comparative example.

Figure 28:
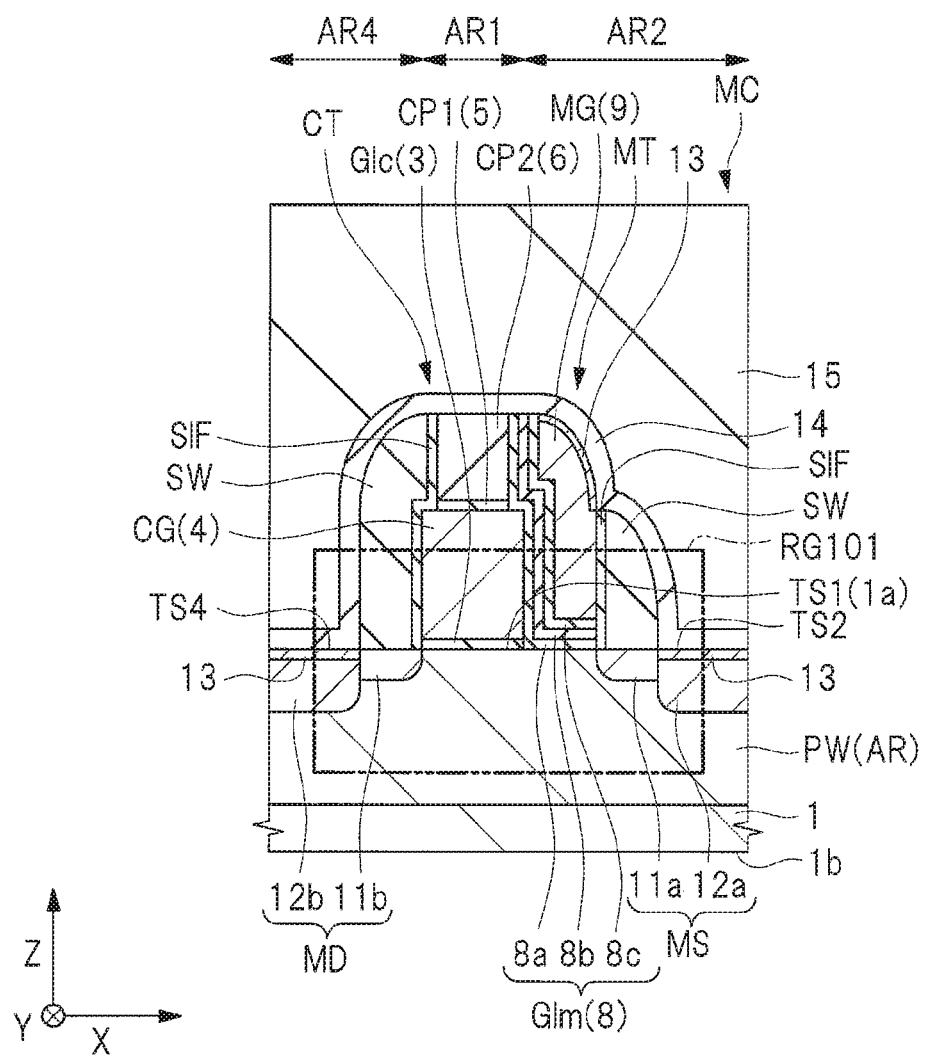
FIG. 28 is a cross-sectional view of a principal part of a semiconductor device according to a modified example.
Figure 29:
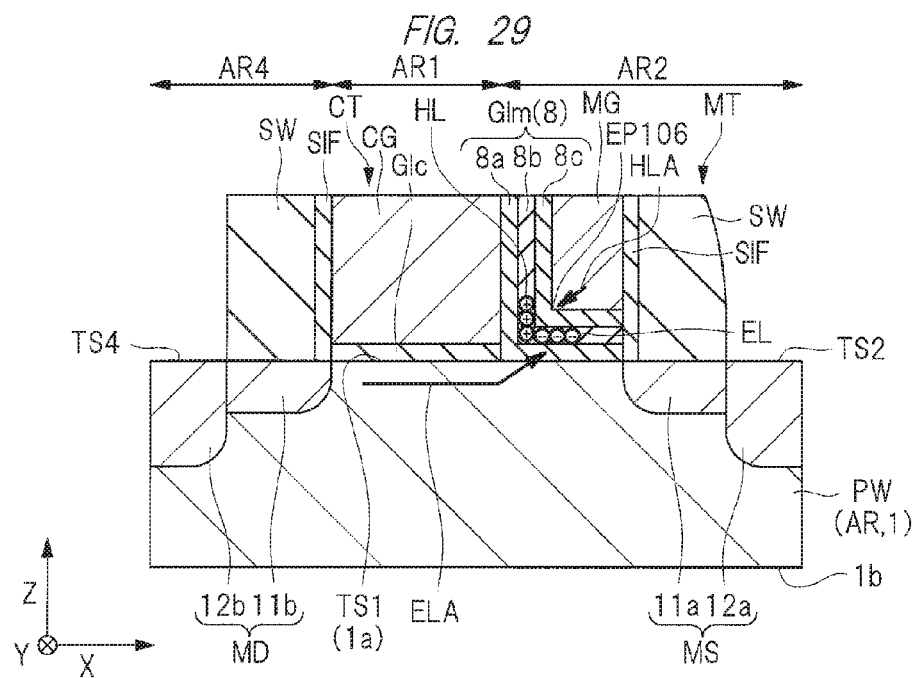
FIG. 29 is a cross-sectional view of a principal part of a semiconductor device according to a modified example.

Each of FIGS. 28 and 29 is a cross-sectional view of a principal part of a semiconductor device in a comparative example. The cross-sectional view of FIG. 29 illustrates a region RG101 surrounded by a two-dot and dash line in the cross-sectional view of FIG. 28 so as to be enlarged.

As illustrated in FIGS. 28 and 29, in the semiconductor device in the comparative example, a semiconductor substrate 1 below a memory gate electrode MG is not bored, so that an upper surface TS2 of a region AR2 is arranged at the same height position as that of an upper surface TS1 of a region AR1. A region AR3 (see FIG. 1) is not arranged between the region AR1 and the region AR2, and a connection surface TS3 (see FIG. 1) connecting the upper surface TS1 and the upper surface TS2 is not formed, either.

Note that an upper surface TS4 of a region AR4 is also arranged at the same height position as that of the upper surface TS1 of the region AR1. A region AR5 (see FIG. 1) is not arranged between the region AR1 and the region AR4, and a connection surface TS5 (see FIG. 1) connecting the upper surface TS1 and the upper surface TS4 is not formed, either.

In the semiconductor device in the comparative example, the entire silicon nitride film 8b in a portion positioned between the memory gate electrode MG and a p-type well PW is parallel to an upper surface of the semiconductor substrate 1. Thus, if data is written by injecting electrons serving as hot electrons into the silicon nitride film 8b serving as a charge accumulating portion in an insulating film 8 in a memory transistor by using the above-described SSI system, the electrons are easy to be uniformly injected into the silicon nitride film 8b in the portion positioned between the memory gate electrode MG and the p-type well PW. That is, as indicated by an arrow ELA in FIG. 29, electrons EL are also easy to be injected into not only a portion closer to a semiconductor region MD serving as a drain region but also a portion closer to a semiconductor region MS serving as a source region in the silicon nitride film 8b in the portion positioned between the memory gate electrode MG and the p-type well PW.

On the other hand, in the semiconductor device in the comparative example, if data is erased by injecting holes into the silicon nitride film 8b using the above-described FN tunneling phenomenon, an electric field between the memory gate electrode MG and the p-type well PW is concentrated on an end EP106 of a lower surface of the memory gate electrode MG which is closer to a control gate electrode CG. Thus, as indicated by the arrow HLA in FIG. 29, the holes HL are easy to be injected into a portion closer to the p-type well PW, i.e., into a lower portion in the silicon nitride film 8b in a portion positioned between the memory gate electrode MG and the control gate electrode CG.

Therefore, in the semiconductor device in the comparative example, a distribution of electrons injected into the silicon nitride film 8b when data is written and a distribution of holes injected into the silicon nitride film 8b when data is erased are different or separated from each other. Thus, when the writing operation and the erasing operation are repeated many times, the number of holes remaining in a gate insulating film GIm including the silicon nitride film 8b increases, and a retention property of a memory cell decreases. Therefore, a property of the semiconductor device cannot be improved.

Here, the retention property of the memory cell can be evaluated by a temporal change of a threshold voltage of the memory transistor obtained when the memory transistor is placed for a long time, e.g., for about 100 hours at a higher temperature than a room temperature, e.g., about 150° C. after the writing operation and the erasing operation are repeated many times, e.g., about 1000 times.

When the gate length of the memory gate electrode MG decreases as a nonvolatile memory is miniaturized as described above, an effect of capable of reducing power consumption becomes more significant in the case of usage of the erasure method based on the FN tunneling phenomenon than the case of the usage of the erasure method based on the BTBT phenomenon. However, as described above, the case of the usage of the erasure method based on the FN tunneling phenomenon significantly has a problem of the difference between the distribution of holes injected into the silicon nitride film 8b when data is erased and the distribution of electrons injected into the silicon nitride film 8b when data is written. Thus, the nonvolatile memory cannot be easily miniaturized.

Meanwhile, in the semiconductor device in the present embodiment, the upper surface TS2 is lower than the upper surface TS1, and the connection surface TS3 connecting the upper surface TS1 and the upper surface TS2 is formed between the upper surface TS1 and the upper surface TS2. The end EP1 of the connection surface TS3 which is closer to the upper surface TS2 is arranged closer to the memory gate electrode MG in the X-axis direction than the end EP2 of the connection surface TS3 which is closer to the upper surface TS1, and is arranged lower than the end EP2 in the Z-axis direction.

In the semiconductor device in the present embodiment, the silicon nitride film 8b in the portion positioned between the memory gate electrode MG and the p-type well PW includes the portion P1 (see FIG. 4) formed along the upper surface TS2 and the portion P2 (see FIG. 4) formed along the connection surface TS3. Thus, if data is written by injecting electrons serving as hot electrons into the silicon nitride film 8b by using the above-described SSI system, the electrons are easy to be injected into the portion P2 and are difficult to be injected into the portion P1 after intersecting the connection surface TS3 as indicated by the arrow ELA in FIG. 4. That is, the electrons EL are easy to be injected into a part of the silicon nitride film 8b in the portion positioned between the memory gate electrode MG and the p-type well PW, the part being closer to the semiconductor region MD serving as a drain region, and are difficult to be injected into a part of the same closer to the semiconductor region MS serving as a source region.

On the other hand, in the semiconductor device in the present embodiment, as described above with reference to FIG. 4, the memory gate electrode MG includes the electrode portion MG1 formed on the upper surface TS2 and the electrode portion MG2 formed closer to the control gate electrode CG than the electrode portion MG1. The electrode portion MG2 has the connection surface BS2 serving as a lower surface connecting the lower surface BS1 of the electrode portion MG1 and the side surface BS3 of the electrode portion MG2 which is closer to the control gate electrode CG. The end EP5 of the connection surface BS2 of the electrode portion MG2 is connected to the lower surface BS1 of the electrode portion MG1, and an end EP6 of the connection surface BS2 of the electrode portion MG2 is connected to the side surface BS3 of the electrode portion MG2. The end EP5 is arranged closer to the positive side in the X-axis direction than the end EP6, and is arranged lower than the end EP6 in the Z-axis direction.

The corner AP1 is formed by the lower surface BS1 and the connection surface BS2, and the corner AP2 is formed by the connection surface BS2 and the side surface BS3.

In such a case, if data is erased by injecting holes into the silicon nitride film 8b using the above-described FN tunneling phenomenon, an electric field between the memory gate electrode MG and the p-type well PW is concentrated on not only the end EP6 but also the end EP5. Thus, as indicated by the arrow HLA in FIG. 4, the holes HL are also injected into the portion P2 in addition to a portion closer to the p-type well PW, i.e., on the lower side of the silicon nitride film 8b in the portion positioned between the memory gate electrode MG and the control gate electrode CG, i.e., the lower side of the portion P3.

Thus, in the semiconductor device in the present embodiment, electrons are also injected into the portion P2 of the silicon nitride film 8b even when data is written, and holes are also injected into the portion P2 of the silicon nitride film 8b even when data is erased. Therefore, in the semiconductor device in the present embodiment, the distribution of electrons injected into the silicon nitride film 8b when data is written and the distribution of holes injected into the silicon nitride film 8b when data is erased are close to or become the same as each other. Thus, even if the writing operation and the erasing operation are repeated many times, the number of holes remaining in the gate insulating film GIm including the silicon nitride film 8b does not increase. Therefore, the decrease in the retention property of the memory cell can be prevented or suppressed, so that a property of the semiconductor device can be improved.

Even in the technique disclosed in Patent Document 1 described above, note that the semiconductor substrate has a first surface and a second surface lower than the first surface from the first surface toward a depth direction, a control gate electrode is provided on the first surface, and a memory gate electrode is provided on the second surface. In the technique disclosed in Patent Document 1 described above, a connection surface between the first surface and the second surface is perpendicular to both the first surface and the second surface.

However, the technique disclosed in Patent Document 1 described above is a technique for solving the problems in the small width of the memory gate electrode, such as the short length of the channel below the memory gate electrode and the increase in the off-leak current. Therefore, in the technique disclosed in Patent Document described above, it is difficult to inline a connection surface so that an end of the connection surface which is closer to the second surface is positioned closer to a positive side in an X-axis direction than an end of the connection surface which is closer to a first surface and so that the end of the connection surface is positioned lower than the end of the connection surface which is closer to the first surface. This is because the length of the channel below the memory gate electrode is shortened, which results in the difficulty in solving the problem in Patent Document 1 described above.

<Preferable Range of Inclination Angle of Connection Surface>

Figure 30:
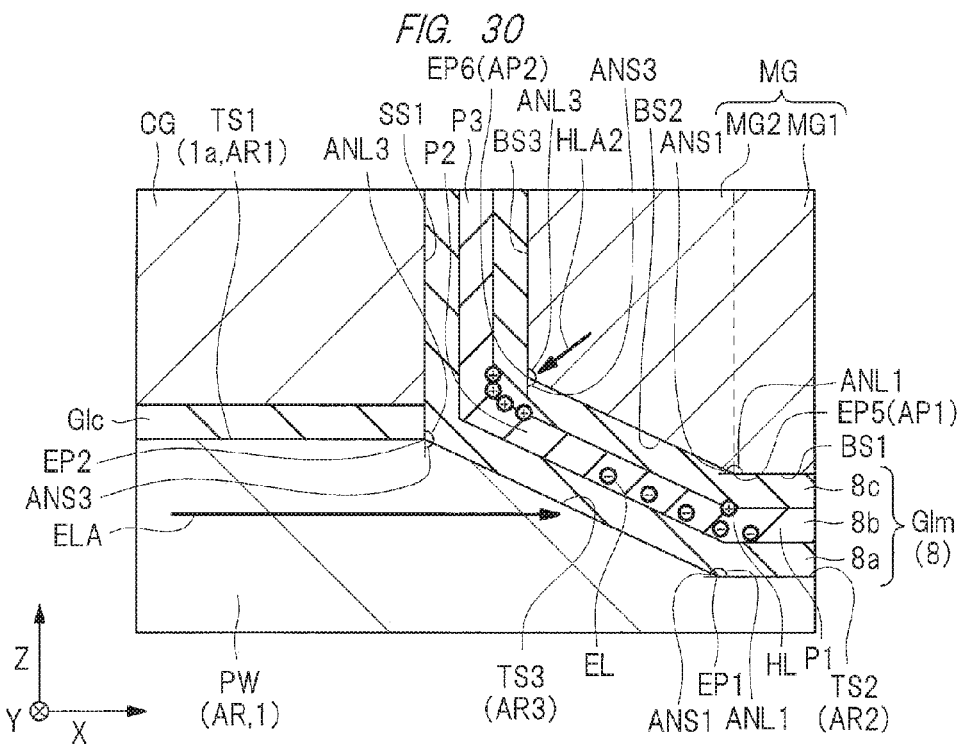
FIG. 30 is a cross-sectional view of a principal part of a semiconductor device according to a first example.
Figure 31:
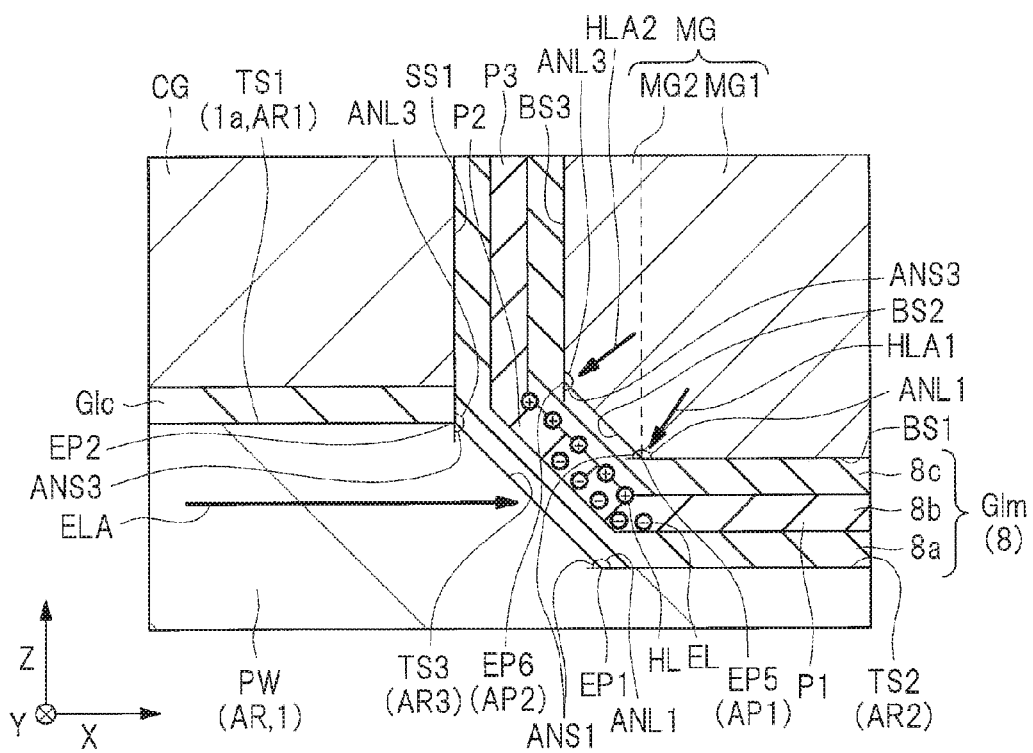
FIG. 31 is a cross-sectional view of a principal part of a semiconductor device according to a second example.
Figure 32:
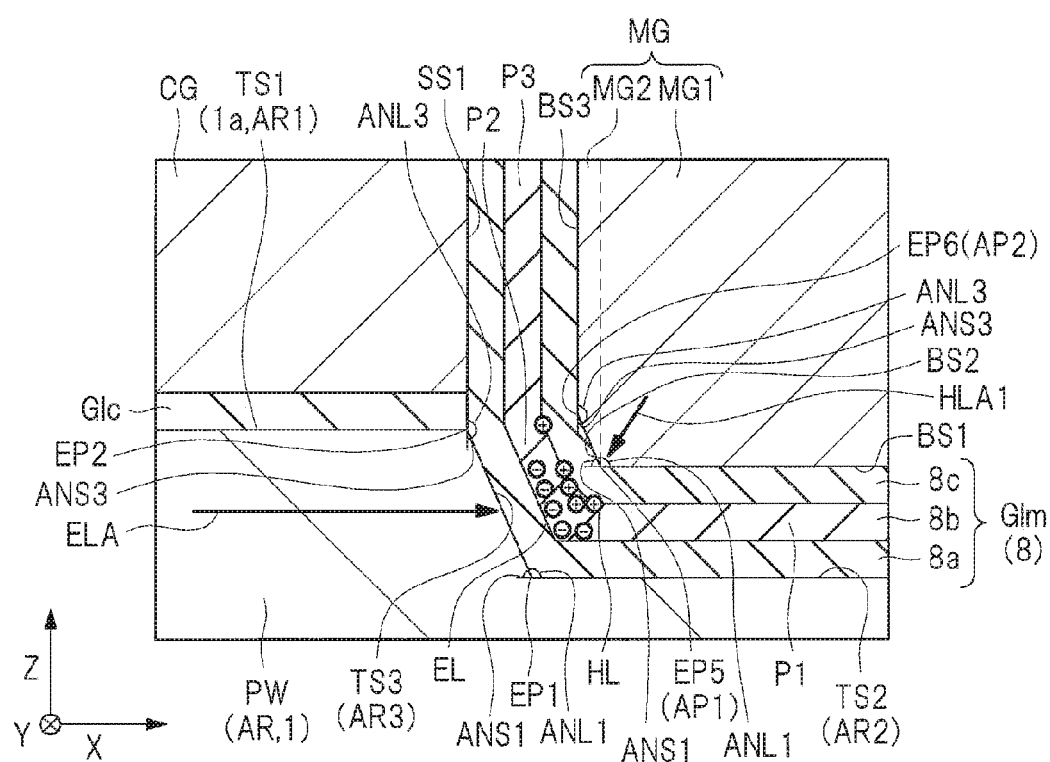
FIG. 32 is a cross-sectional view of a principal part of a semiconductor device according to a third example.
Figure 33:
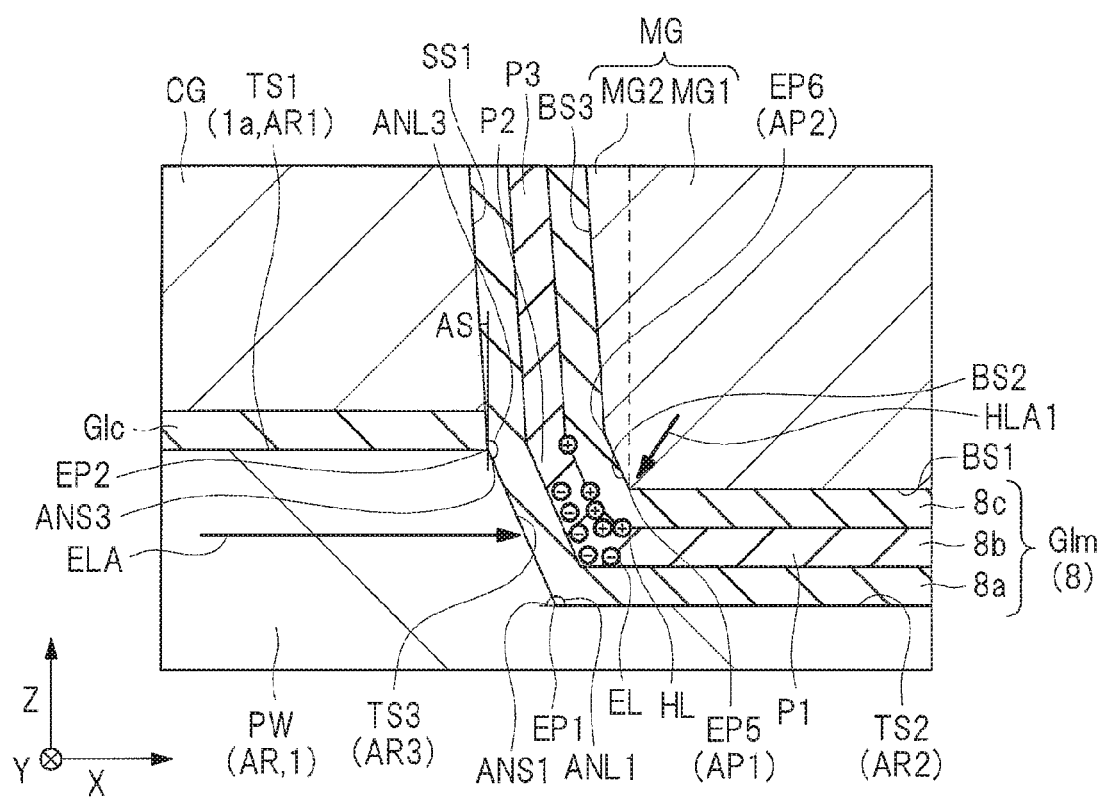
FIG. 33 is a cross-sectional view of a principal part of a semiconductor device according to a fourth example.

Next, a preferable range of an inclination angle of the connection surface TS3 will be described in comparison of first to fourth examples with one another. FIG. 30 is a cross-sectional view of a principal part of a semiconductor device according to the first example, FIG. 31 is a cross-sectional view of a principal part of a semiconductor device according to the second example, FIG. 32 is a cross-sectional view of a principal part of a semiconductor device according to the third example, and FIG. 33 is a cross-sectional view of a principal part of a semiconductor device according to the fourth example. Each of the cross-sectional views of FIGS. 30 to 33 illustrates the periphery of the connection surface TS3 in the cross-sectional view of FIG. 4 so as to be enlarged.

First, as the first example to the third example illustrated in FIGS. 30 to 32, a case in which a side surface SS1 of a control gate electrode CG is parallel to a YZ plane and is not inclined with respect to the YZ plane will be described.

As described above, an angle made by a connection surface TS3 and an upper surface TS2 is defined as an angle ANL1 serving as an acute angle. At this time, an obtuse angle between the connection surface TS3 and the upper surface TS2 is represented by an angle ANS1 The sum of the angle ANS1 and the angle ANL1 is equal to 180°.

Hereinafter, an angle made by the connection surface TS3 and a side surface SS1 of the control gate electrode CG on the positive side in the X-direction is defined as an angle ANS3 serving as an acute angle. At this time, an obtuse angle between the connection surface TS3 and the side surface SS1 of the control gate electrode CG is represented by an angle ANS3. The sum of the angle ANS3 and the angle ANL4 is equal to 180°.

Since the side surface SS1 of the control gate electrode CG is parallel to the YZ plane as described above, note that the angle ANS1 is equal to an angle made by the connection surface TS3 and the YZ plane.

In the first example illustrated in FIG. 30, the angle ANS3 is larger than the angle ANS1 (ANS3>ANS1), that is, the angle ANL3 is smaller than the angle ANL1 (ANL3<ANL1). In the second example illustrated in FIG. 31, the angle ANS3 is equal to the angle ANS1 (ANS3=ANS1), that is, the angle ANL3 is equal to the angle ANL1 (ANL3=ANL1). In the third example illustrated in FIG. 32, the angle ANS3 is smaller than the angle ANS1 (ANS3<ANS1), that is, the angle ANL3 is larger than the angle ANL1 (ANL3>ANL1).

In the following, in order to facilitate comparison in influence of the inclination angle of the connection surface TS3, a distance between the upper surface TS1 and the upper surface TS2 in the Z-axis direction is made equal among all the first example in FIG. 30, the second example illustrated in FIG. 31, and the third example illustrated in FIG. 32.

In the first example illustrated in FIG. 30, when data is written by injecting electrons serving as hot electrons into a silicon nitride film 8b by using an SSI system, electrons EL are easy to be injected into a portion P2 after intersecting the connection surface TS3 as indicated by an arrow ELA in FIG. 30. In the first example illustrated in FIG. 30, the center of the portion P2 in the X-axis direction is positioned closer to the positive side, i.e., closer to the memory gate electrode MG in the X-direction than those in the second example illustrated in FIG. 31 and the third example illustrated in FIG. 32. Therefore, although the electrons EL are easier to be injected into a portion of the silicon nitride film 8b which is closer to the semiconductor region MD (see FIG. 4) than in the comparative example, the electrons EL are more difficult to be injected into the portion closer to the semiconductor region MD (see FIG. 4) than in the second example and the third example.

On the other hand, in the first example illustrated in FIG. 30, when data is erased by injecting holes into the silicon nitride film 8b by using the above-described FN tunneling phenomenon, most of the electric field between the memory gate electrode MG and a p-type well PW is concentrated on the end EP6, i.e., the corner AP2 while a part of the electric field is also concentrated on the end EP5, i.e., the corner AP1. Thus, as indicated by an arrow HLA2 in FIG. 30, while most of the holes HL are injected into the silicon nitride film 8b in a portion in periphery of the corner AP2, some of the holes HL are also injected into the silicon nitride film 8b in a portion in periphery of the corner AP1.

Thus, in the first example illustrated in FIG. 30, the distribution of electrons injected into the silicon nitride film 8b when data is written and the distribution of holes injected into the silicon nitride film 8b when data is erased are closer to each other than in the comparative example but are more separated from each other than in the second example and the third example.

Next, in the second example illustrated in FIG. 31, when data is written by injecting electrons serving as hot electrons into the silicon nitride film 8b by using the SSI system, the electrons EL are easy to be injected into a portion P2 after intersecting the connection surface TS3 as indicated by an arrow ELA in FIG. 31. In the second example illustrated in FIG. 31, the center of the portion P2 in the X-axis direction is positioned closer to the positive side, i.e., closer to the memory gate electrode MG in the X-axis direction than that in the third example illustrated in FIG. 32 while the center of a portion P3 in the X-axis direction is positioned closer to the negative side, i.e., closer to the control gate electrode CG in the X-direction than that in the first example illustrated in FIG. 30. Therefore, while the electrons EL are easier to be injected into a portion of the silicon nitride film 8b which is closer to the semiconductor region MD (see FIG. 4) than in the first example, the electrons EL are more difficult to be injected into a portion which is closer to the semiconductor region MD (see FIG. 4) than in the third example.

On the other hand, in the second example illustrated in FIG. 31, when data is erased by injecting the holes into the silicon nitride film 8b by using the above-described FN tunneling phenomenon, the electric field between the memory gate electrode MG and the p-type well PW is concentrated on the end EP5, i.e., the corner AP1 and on the end EP6, i.e., the corner AP2 to substantially the same extent as each other. Thus, as indicated by an arrow HLA1 in FIG. 31, a ratio of holes HL injected into the silicon nitride film 8b in a portion in periphery of the corner AP1 with respect to the holes injected into the silicon nitride film 8b becomes higher than that in the first example but lower than that in the third example. And, as indicated by an arrow HLA2 in FIG. 31, a ratio of holes HL injected into the silicon nitride film 8b in a portion in periphery of the corner AP2 with respect to the same becomes lower than that in the first example but higher than that in the third example.

Thus, in the second example illustrated in FIG. 31, the distribution of electrons injected into the silicon nitride film 8b when data is written and the distribution of holes injected into the silicon nitride film 8b when data is erased are closer to each other than in the first example but more separated from each other than in the third example.

Next, in the third example illustrated in FIG. 32, when data is written by injecting electrons serving as hot electrons into the silicon nitride film 8b by using the SSI system, the electrons EL are easy to be injected into a portion P2 after intersecting the connection surface TS3 as indicated by an arrow ELA in FIG. 32. In the third example illustrated in FIG. 32, the center of the portion P2 in the X-axis direction is positioned closer to the negative side, i.e., closer to the control gate electrode CG in the X-axis direction than those in the first example illustrated in FIG. 30 and the second example illustrated in FIG. 31. Therefore, the electrons EL are easier to be injected into a portion of the silicon nitride film 8b which is closer to the semiconductor region MD (see FIG. 4) than in both the first and second examples.

On the other hand, in the third example illustrated in FIG. 32, when data is erased by injecting holes into the silicon nitride film 8b by using the above-described FN tunneling phenomenon, the electric field between the memory gate electrode MG and the p-type well PW is not concentrated on the end EP6, i.e., the corner AP2 while the electric field is concentrated on the end EP5, i.e., the corner AP1. Thus, while some of the holes HL are injected into the silicon nitride film 8b in a portion in periphery of the corner AP2, most of the holes HL are injected into the silicon nitride film 8b in a portion in periphery of the corner AP1 as indicated by an arrow HLA1 in FIG. 30.

Thus, in the third example illustrated in FIG. 32, the distribution of the electrons EL injected into the silicon nitride film 8b when data is written and the distribution of the holes HL injected into the silicon nitride film 8b when data is erased are closer to each other than in the first example and the second example or the same as each other.

That is, when the first example to the third example illustrated in FIGS. 30 to 32 are compared with one another, the distribution of electrons injected into the silicon nitride film 8b when data is written and the distribution of holes injected into the silicon nitride film 8b when data is erased are closer to each other in an order of the first example, the second example, and the third example. Thus, the effect of preventing or suppressing the decrease in the retention property of the memory cell is larger in the order of the first example, the second example, and the third example, so that the effect of improving the property of the semiconductor device is larger in the order of the first example, the second example, and the third example.

However, when the angle ANS3 is 0°, i.e., when the connection surface TS3 becomes parallel to the YZ plane, the on-state current of the control gate transistor decreases. Therefore, the angle ANS3 is desirably larger than 0. That is, the end EP1 is desirably arranged closer to the memory gate electrode MG than the end EP2 in the X-axis direction, and is desirably arranged lower than the end EP2 in the Z-axis direction.

When the first example to the third example illustrated in FIGS. 30 to 32 are compared with one another, in order to cause the distribution of electrons injected into the silicon nitride film 8b when data is written and the distribution of holes injected into the silicon nitride film 8b when data is erased to be close to each other, a position of the corner AP1 and a position of the corner AP2 are preferably brought close to each other in the X-axis direction. The closer the position of the corner AP1 and the position of the corner AP2 come to each other, the higher a ratio of a portion positioned closer to the negative side, i.e., closer to the control gate electrode CG in the X-axis direction than the corner AP1 with respect to a portion P1 formed along the upper surface TS2 of the silicon nitride film 8b becomes larger. When the position of the corner AP1 and the position of the corner AP2 come close to each other, the end EP1 is positioned below not the memory gate electrode MG but the gate insulating film GIm.

Alternatively, even if the angle ANS1 is the same, by, for example, shortening a distance between the upper surface TS1 and the upper surface TS2 in the Z-axis direction, the ratio of the portion positioned below not the memory gate electrode MG but the gate insulating film GIm with respect to the portion P1 of the silicon nitride film 8b, the portion P1 being formed along the upper surface TS2, can be increased.

When an insulating film 8 is formed on the upper surface TS2, on the connection surface TS3, and on the side surface SS1 of the control gate electrode CG, the respective thicknesses of the insulating films 8 on all portions, i.e., the respective film thicknesses of the silicon oxide film 8a, the silicon nitride film 8b, and a silicon oxide film 8c can be substantially equal to one another. Thus, the lower surface BS1 of the electrode portion MG1 becomes substantially parallel to the upper surface TS2 of the region AR2, and the connection surface BS2 of the electrode portion MG2 becomes substantially parallel to the connection surface TS3 of the region AR3.

Therefore, in the present embodiment, respective shapes of the corners AP1 and AP2 in the memory gate electrode MG can be controlled by adjusting a shape of a stepped portion formed by the upper surface TS1, the upper surface TS2, and the connection surface TS3. And, by controlling the respective shapes of the corners AP1 and AP2 in the memory gate electrode MG, the distribution of electrons injected into the silicon nitride film 8b when data is written and the distribution of holes injected into the silicon nitride film 8b when data is erased can be brought close to each other.

As illustrated in FIGS. 30 to 32, the same tendency is obtained among the first example to the third example even if the angle ANS1 serving as an acute angle is defined as an angle made by the connection surface BS2 and the lower surface BS1, and even if the angle ANS3 serving as an acute angle is defined as an angle made by the connection surface BS2 and a side surface BS3. That is, the distribution of electrons injected into the silicon nitride film 8b when data is written and the distribution of holes injected into the silicon nitride film 8b when data is erased are closer to each other in an order of the first example, the second example, and the third example.

Here, as the fourth example illustrated in FIG. 33, consider a case in which a side surface SS1 of a control gate electrode CG is inclined by only an angle AS with respect to a YZ plane so that an upper end of the side surface SS1 is positioned closer to the opposite side to a memory gate electrode MG than a lower end of the side surface SS1 in an X-axis direction. Also at this time, an angle made by a connection surface TS3 and an upper surface TS2 is defined as an angle ANL1 serving as an acute angle, and an angle made by the connection surface TS3 and the side surface SS1 of the control gate electrode CG is defined as an angle ANS3 serving as an acute angle. The fourth example illustrated in FIG. 33 shows a case in which the angle ANS3 is smaller than the angle ANS1 (ANS3<ANS1), i.e., the angle ANL3 is larger than the angle ANL1 (ANL3>ANL1) as similar to the third example illustrated in FIG. 32.

In the fourth example illustrated in FIG. 33, the angle ANS3 becomes smaller by the angle AS than that in a case in which the side surface SS1 of the control gate electrode CG is parallel to the YZ-plane. Thus, the condition in the third example which is the most preferable condition described with reference to FIG. 32, i.e., the condition in which "the angle ANS3<the angle ANS1" is easily satisfied, so that the distribution of electrons injected into a silicon nitride film 8b when data is written and the distribution of holes injected into the silicon nitride film 8b when data is erased further come close to each other. Therefore, the remaining of the holes in the charge accumulating portion can be prevented or suppressed, and the retention property of the memory cell can be further improved.

<Preferable Ranges of Length of Connection Surface and Length of Lower Surface of Memory Gate Electrode>

Figure 34:
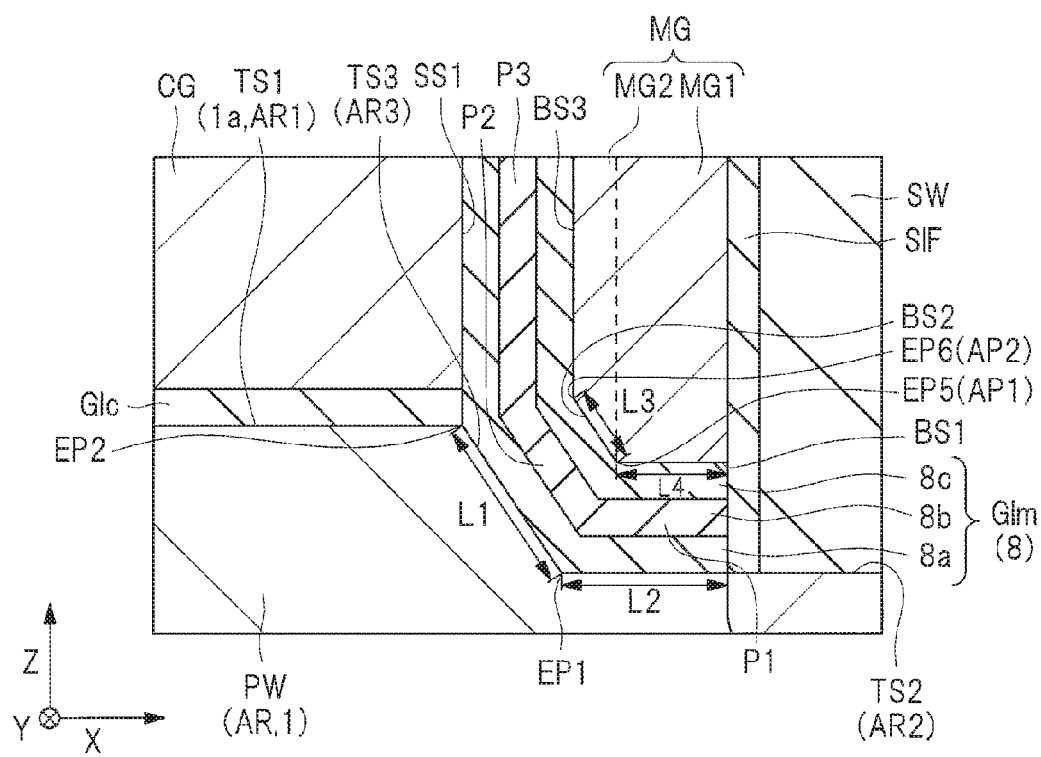
FIG. 34 is a cross-sectional view of a principal part of a semiconductor device according to a fifth example.

Next, respective preferable ranges of the length of a connection surface TS3 and the length of a lower surface of a memory gate electrode MG will be described with reference to a fifth example. FIG. 34 is a cross-sectional view of a principal part of a semiconductor device according to the fifth example. The cross-sectional view of FIG. 34 illustrates the periphery of the connection surface TS3 in the cross-sectional view of FIG. 4 so as to be enlarged.

As illustrated in FIG. 34, the length L1 of the connection surface TS3 in a direction parallel to the connection surface TS3, i.e., the length L1 serving as a distance between an end EP1 and an end EP2 in a cross-sectional surface perpendicular to a Y-axis direction is larger than the length L2 in an X-axis direction of an upper surface TS2 of a portion below a gate insulating film GIm.

Thus, when data is written, a ratio of a portion P2 of the silicon nitride film 8b, the portion P2 intersecting a direction in which electrons injected as hot electrons move by using an SSI system, can be larger than a ratio of a portion P1 of the same, the portion P1 being parallel to the direction in which the electrons move. Thus, when data is written by injecting electrons into the silicon nitride film 8b by using an SSI system, the electrons become easy to be injected into the portion P2 after intersecting the connection surface TS3. That is, the length L1 of the connection surface TS3 is preferably made larger than the length L2 of the upper surface TS2 of the portion positioned below the gate insulating film GIm in the viewpoint of adjusting the distribution of the injected electrons in the data writing operation.

By forming the length L1 of the connection surface TS3 to be larger than the length L2 of the upper surface TS2 of the portion below the gate insulating film GIm, the gate length of the memory gate electrode MG is easily shortened, and therefore, this is advantageous for miniaturization of the nonvolatile memory.

On the other hand, as illustrated in FIG. 34, in the cross-sectional surface perpendicular to the Y-axis direction, the length L3 of a connection surface BS2 serving as a lower surface of an electrode portion MG2 in a direction parallel to the connection surface BS2, i.e., the length L3 serving as a distance between an end EP5 and an end EP6 is preferably shorter than the length L4 of a lower surface BS1 of an electrode portion MG1 in the X-axis direction.

Thus, when data is erased, a corner AP1 and a corner AP2 each serving as a portion on which an electric field between the memory gate electrode MG and a p-type well PW is concentrated can be brought close to each other. Thus, when data is erased by injecting the holes into the silicon nitride films 8b by using an FN tunneling phenomenon, the holes can be reliably injected into the portion P2 of the silicon nitride film 8b. That is, in the viewpoint of adjusting the distribution of the injected holes in the data erasing operation, the length L3 of the connection surface BS2 is preferably made shorter than the length L4 of the lower surface BS1.

If no corner is formed between the connection surface TS3 and the upper surface TS2 as described above with reference to FIG. 3, note that the length L1 can be defined as a distance between the end EP2 and an end EP11 (see FIG. 3), and the length L2 can be defined as a distance in the X-axis direction between the end EP11 and an end of the gate insulating film GIm which is on the opposite side to the control gate electrode CG.

And, if no corner is formed between the connection surface BS2 and the lower surface BS1 as described above with reference to FIG. 3, the length L3 can be defined as a distance between the end EP6 and an end EP51 (see FIG. 3), and the length L4 can be defined as a distance in the X-axis direction between the end EP51 and an end of the memory gate electrode MG which is on the opposite side to the control gate electrode CG.

<Principal Feature and Effect of Present Embodiment>

In the semiconductor device according to the present embodiment, the semiconductor substrate includes the region AR3 arranged between the region AR1 and the region AR2, the control gate electrode CG is formed on the upper surface TS1 of the region AR1, and the memory gate electrode MG is formed on the upper surface TS2 of the region AR2. The upper surface TS2 is lower than the upper surface TS1, and the region AR3 has the connection surface TS3 connecting the upper surface TS1 and the upper surface TS2. The gate insulating film GIm is formed between the memory gate electrode MG and the control gate electrode CG, between the memory gate electrode MG and the upper surface TS2, and between the memory gate electrode MG and the connection surface TS3. The end EP1 of the connection surface TS3 which is closer to the upper surface TS2 is arranged closer to the memory gate electrode MG than the end EP2 of the connection surface TS3 which is closer to the upper surface TS1, and is arranged lower than the end EP2.

Thus, the distribution of electrons injected into the silicon nitride film 8b when data is written and the distribution of holes injected into the silicon nitride film 8b when data is erased are close to or the same as each other. Thus, even when the writing operation and the erasing operation are repeated many times, the number of holes remaining in the gate insulating film GIm including the silicon nitride film 8b does not increase. Therefore, the retention property of the memory cell can be improved, and the property of the semiconductor device can be improved.

In the foregoing, the invention made by the present inventor has been concretely described based on the embodiments. However, it is needless to say that the present invention is not limited to the foregoing embodiments and various modifications and alterations can be made within the scope of the present invention.

EXPLANATION OF REFERENCE CHARACTERS 1 semiconductor substrate
1a main surface
3, 5, 6, 8, 14 insulating film
4, 9 conductive film
7 film
8a, 8c silicon oxide film
8b silicon nitride film
11a, 11b n⁻-type semiconductor region
12a, 12b n⁺-type semiconductor region
13 metal silicide layer
15 interlayer insulating film
ANL1 to ANL3, ANS1 to ANS3, AS angle
AP1, AP2 corner
AR active region
AE1 to AR5 region
BS1 lower surface
BS11, BS21 plane
BS2 connection surface
BS3 side surface
CG control gate electrode
CNT contact hole
CP1, CP2 cap insulating film
CT control transistor
EL electrons
ELA, HLA, HLA1, HLA2 arrow
EP1, EP11, EP2 to EP5, EP51, EP6 end
FT1 film thickness
Glc, GIm gate insulating film
HL hole
IT1 interval
L1 to L4 length
MC, MC1, MC2 memory cell
MD, MS semiconductor region
MG memory gate electrode
MG1, MG2 electrode portion
MT memory transistor
P1 to P3 portion
PG plug
PW p-type well
R1 to R3 resist Pattern
RF1 to RF3 resist film
RG1, RG2 region
SIF insulating film
SOF1, SOF2 sacrificial oxide Film
SP11, SP12, SP21 spacer
SS1 side surface
SW sidewall spacer
TS1, TS2, TS4 upper surface
TS21, TS31 plane
TS3, TS5 connection surface
VMG n⁻-type semiconductor region

The invention claimed is:

1. A semiconductor device comprising:
   a semiconductor substrate;
   a first gate electrode formed on a main surface of the semiconductor substrate;
   a first gate insulating film formed between the first gate electrode and the semiconductor substrate;
   a second gate electrode formed on the semiconductor substrate and adjacent to the first gate electrode; and
   a second gate insulating film formed between the second gate electrode and the semiconductor substrate and between the second gate electrode and the first gate electrode and having a charge accumulating portion therein,
   wherein the semiconductor substrate includes a first region, a second region, and a third region on the main surface side,
   the second region is arranged closer to a first side than the first region in a first direction in a plan view,
   the third region is arranged between the first region and the second region,
   the first gate electrode is formed on a first upper surface of the first region,
   the second gate electrode is formed on a second upper surface of the second region,
   the second upper surface is lower than the first upper surface,
   the third region has a first connection surface connecting the first upper surface and the second upper surface,
   the second gate insulating film is formed on the first connection surface and the second upper surface,
   a first end of the first connection surface is connected to the second upper surface,
   a second end of the first connection surface which is on the opposite side to the first end is connected to the first upper surface,
   the first end is arranged closer to the first side than the second end in the first direction, and is arranged lower than the second end, and
   the first connection surface has a constant slope between the first end and the second end wherein the semiconductor substrate includes a fourth region on the main surface side, the fourth region is arranged closer to the opposite side to the first side than the first region in the first direction in a plan view, a third upper surface of the fourth region is lower than the first upper surface, and the second upper surface is lower than the third upper surface.

2. The semiconductor device according to claim 1,
wherein the semiconductor substrate includes a fifth region on the main surface side,
the fifth region is arranged between the first region and the fourth region,
the fifth region has a second connection surface connecting the first upper surface and the third upper surface,
a third end of the second connection surface is connected to the third upper surface,
a fourth end of the second connection surface which is on the opposite side to the third end is connected to the first upper surface, and
the third end is arranged closer to the opposite side to the first side than the fourth end in the first direction, and is arranged lower than the fourth end.

3. The semiconductor device according to claim 2,
wherein an angle serving as an acute angle made by the first connection surface and the second upper surface is larger than an angle serving as an acute angle made by the second connection surface and the third upper surface.

4. The semiconductor device according to claim 1,
wherein an angle serving as an acute angle made by the first connection surface and a first side surface of the first gate electrode which is on the first side in the first direction is smaller than an angle serving as an acute angle made by the first connection surface and the second upper surface.

5. The semiconductor device according to claim 1,
wherein the first gate electrode extends in a second direction perpendicular to the first direction in a plan view, and
a distance between the first end and the second end in a cross-sectional surface perpendicular to the second direction is longer than a length in the first direction of the second upper surface in a portion positioned below the second gate insulating film.

6. The semiconductor device according to claim 1,
wherein the second gate electrode includes:
a first electrode portion formed on the second upper surface; and
a second electrode portion formed closer to the first gate electrode than the first electrode portion,
the second electrode portion has a second lower surface connecting a first lower surface of the first electrode portion and a second side surface of the second electrode portion which is on the first gate electrode side,
a fifth end of the second lower surface is connected to the first lower surface of the first electrode portion,
a sixth end of the second lower surface which is on the opposite side to the fifth end is connected to the second side surface,
the fifth end is arranged closer to the first side than the sixth end in the first direction, and is arranged lower than the sixth end,
the first gate electrode extends in a third direction perpendicular to the first direction in a plan view, and,
in a cross-sectional surface perpendicular to the third direction, a length of the second lower surface in a direction parallel to the second lower surface is shorter than a length of the first lower surface in the first direction.

7. The semiconductor device according to claim 1,
wherein a memory is formed of the first gate electrode, the first gate insulating film, the second gate electrode, and the second gate insulating film.

8. The semiconductor device according to claim 1,
wherein an acute angle between the first connection surface and a plane perpendicular to the first upper surface of the semiconductor substrate, is greater than an acute angle between the first connection surface and a plane of the second upper surface of the semiconductor substrate.

9. The semiconductor device according to claim 1,
wherein the semiconductor substrate includes:
a fourth region including a third upper surface that is lower than the first upper surface and higher than the second upper surface; and
a fifth region including a second connection surface connecting the first upper surface and the third upper surface, and
wherein an angle serving as an acute angle made by the first connection surface and the second upper surface is larger than an angle serving as an acute angle made by the second connection surface and the third upper surface.

10. A method for manufacturing a semiconductor device, comprising the steps of:
(a) preparing a semiconductor substrate;
(b) forming a first gate electrode on a main surface of the semiconductor substrate, and forming a first gate insulating film between the first gate electrode and the semiconductor substrate;
(c) forming an insulating film having a charge accumulating portion therein on the semiconductor substrate and on a surface of the first gate electrode;
(d) forming a conductive film on the insulating film; and
(e) by etching back the conductive film, forming a second gate electrode by leaving the conductive film via the insulating film on a first side surface of the first gate electrode which is on a first side in a first direction in a plan view, and forming a second gate insulating film formed of the insulating film between the second gate electrode and the semiconductor substrate and between the second gate electrode and the first gate electrode,
wherein, in the step (a), the semiconductor substrate including a first region, a second region, and a third region on the main surface side is prepared,
the second region is arranged closer to the first side than the first region in the first direction in a plan view,
the third region is arranged between the first region and the second region,
in the step (b), the first gate electrode is formed on a first upper surface of the first region,
the step (c) further includes the steps of:
(c1) by etching the second region and the third region, forming a second upper surface of the second region to be lower than the first upper surface, and forming a first connection surface connecting the first upper surface and the second upper surface in the third region; and
(c2) after the step (c1), forming the insulating film on the second upper surface, on the first connection surface, and on a surface of the first gate electrode,
in the step (e), the second gate electrode is formed on the second upper surface,
a first end of the first connection surface is connected to the second upper surface,
a second end of the first connection surface which is on the opposite side to the first end is connected to the first upper surface,
the first end is arranged closer to the first side than the second end in the first direction, and is arranged lower than the second end, and the first connection surface has a constant slope between the first end and the second end wherein, in the step (a), the semiconductor substrate including a fourth region on the main surface side is prepared, the fourth region is arranged closer to the opposite side to the first side than the first region in the first direction in a plan view, the method for manufacturing the semiconductor device further includes the step of (g) after the step (b) and before the step (c), by oxidizing a surface of the fourth region, forming a third upper surface of the fourth region to be lower than the first upper surface of the first region, and, in the step (c1), by etching the second region and the third region, the second upper surface is formed to be lower than the third upper surface.

11. The method for manufacturing the semiconductor device according to claim 10, further comprising the step of (f) after the step (b) and before the step (c), forming a first sidewall portion on a second side surface of the first gate electrode which is on the opposite side to the first side surface, wherein the step (f) further includes the steps of:
(f1) forming a first film on the semiconductor substrate so as to cover the first gate electrode, and
(f2) by etching back the first film, forming the first sidewall portion by leaving the first film on the second side surface of the first gate electrode, in the step (c1), the second upper surface is formed to be lower than the first upper surface by etching the second region and the third region while using the first gate electrode and the first sidewall portion as a mask, and the step (c) further includes the step of
(c3) after the step (c2), removing the first sidewall portion.

12. The method for manufacturing the semiconductor device according to claim 11, wherein, in the step (f2), by etching back the first film, the first sidewall portion is formed on the second side surface of the first gate electrode, and a second sidewall portion is formed by leaving the first film on the first side surface of the first gate electrode, and the step (f) further includes the steps of:
(f3) forming a mask film on the semiconductor substrate so as to cover the first sidewall portion and the second sidewall portion;
(f4) by patterning the mask film, forming a mask pattern formed of the mask film covering the first sidewall portion, and exposing the second sidewall portion from the mask film;
(f5) after the step (f4), removing the second sidewall portion; and
(f6) after the step (f5), removing the mask pattern.

13. The method for manufacturing the semiconductor device according to claim 10, wherein, in the step (a), the semiconductor substrate including a fifth region on the main surface side is prepared, the fifth region is arranged between the first region and the fourth region, in the step (g), a second connection surface connecting the first upper surface and the third upper surface is formed in the fifth region, a third end of the second connection surface is connected to the third upper surface, a fourth end of the second connection surface which is on the opposite side to the third end is connected to the first upper surface, and the third end is arranged closer to the opposite side to the first side than the fourth end in the first direction, and is arranged lower than the fourth end.

14. The method for manufacturing the semiconductor device according to claim 13, wherein an angle serving as an acute angle made by the first connection surface and the second upper surface is larger than an angle serving as an acute angle made by the second connection surface and the third upper surface.

15. The method for manufacturing the semiconductor device according to claim 10, wherein, in the step (b), a cap insulating film is formed on the first gate electrode, and, in the step (c1), by etching the second region and the third region while using the cap insulating film as a mask, the second upper surface is formed to be lower than the first upper surface.

* * * * *